(12) United States Patent
Nakamura et al.

(10) Patent No.: US 6,278,176 B1
(45) Date of Patent: *Aug. 21, 2001

(54) SEMICONDUCTOR DEVICE AND PROCESS FOR PRODUCING THE SAME

(75) Inventors: Hisao Nakamura, Akiruno; Seiichi Ichihara, Hino; Ryosuke Kimoto, Hamura; Hiroshi Kawakubo, Fussa; Ryo Haruta, Kodaira; Hiroshi Koyama, Tachikawa, all of (JP)

(73) Assignees: Hitachi, Ltd.; Hitachi Microcomputer System Ltd., both of Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/545,463

(22) Filed: Apr. 7, 2000

Related U.S. Application Data

(62) Division of application No. 09/007,079, filed on Jan. 14, 1998, now Pat. No. 6,060,770.

(30) Foreign Application Priority Data

Jan. 31, 1997 (JP) .................................................. 9-017949

(51) Int. Cl.$^7$ ................................................. H01L 23/02
(52) U.S. Cl. ............................................ 257/668; 257/692
(58) Field of Search ................................. 257/668, 692, 257/735, 773

(56) References Cited

U.S. PATENT DOCUMENTS

| 5,402,255 | 3/1995 | Nakanishi et al. . |
| 5,659,198 | 8/1997 | Okutomo et al. . |
| 5,726,491 | 3/1998 | Tajima et al. . |
| 5,767,571 | 6/1998 | Kimura et al. . |
| 5,825,081 | 10/1998 | Hosomi et al. . |

FOREIGN PATENT DOCUMENTS 3-57248    3/1991  (JP) .

*Primary Examiner*—Olik Chaudhuri
*Assistant Examiner*—Douglas A. Wille
(74) *Attorney, Agent, or Firm*—Mattingly, Stanger & Malur, P.C.

(57) ABSTRACT

The thickness of a tape carrier package having a semiconductor chip is made uniform where bonding pads are concentrated on one side of the semiconductor chip. The tape carrier package is such that dummy pads 6b are arranged on one side opposite to the side on which bonding pads (effective pins) 6a are arranged in the semiconductor chip. Dummy leads 5 are formed on an insulating tape 4. The semiconductor chip is supported with inner lead portions 5a connected to the corresponding bonding pads 6a and the inner lead portions 5a of the dummy leads 5 connected to the corresponding dummy pads 6b.

11 Claims, 31 Drawing Sheets

EXTERNAL APPEARANCE
OF IC CARD (SURFACE)

PACKAGING PORTION
OF IC CARD (SURFACE)

EXTERNAL APPEARANCE OF IC CARD (UNDERSURFACE)

PACKAGING PORTION OF IC CARD (UNDERSURFACE)

SECTION OF IC CARD

SEMICONDUCTOR DEVICE AND PROCESS FOR PRODUCING THE SAME

This is a divisional application of U.S. Ser. No. 09/007,079, filed Jan. 14, 1998, now U.S. Pat. No. 6,060,770.

BACKGROUND OF THE INVENTION

The present invention relates to a semiconductor device and a process for producing the same, and more particularly to a technology effectively applicable to the manufacture of a semiconductor device having a tape carrier package (called the TCP).

A TCP, a TSOP (Thin Small Outline Package), a TSOJ (Thin Small Outline J-Lead Package) and a TQFP (Thin Quad Flat Package) are well known as LSI packages with which thin semiconductor devices such as IC cards are mounted. Above all, the TCP formed by mounting a semiconductor chip on a thin tape made of insulating material such as polyimide is usable for realizing an extra-thin LSI package because the thickness of resin with which the semiconductor chip is encapsulated is reducible.

A process for making such a TCP comprises the steps of placing a semiconductor chip in a device hole of an insulating tape with leads formed on one side, bonding one end portion (inner lead portion) of each lead to a bump electrode which is pre-formed on the major surface (element-forming side) of the semiconductor chip to electrically connect the lead and the semiconductor chip, encapsulating the semiconductor chip with resin by curing the potting resin applied onto the major surface of the semiconductor chip, cutting away the unnecessary portions of the insulating tape and the leads so that the other end portion (outer lead portion) of each lead can be mounted on a substrate.

Japanese Patent Laid-Open No. 57248/1991, for example, describes such a TPC.

SUMMARY OF THE INVENTION

In the aforementioned TCP, one end portion of each lead is connected via a bump electrode of Au onto the bonding pad of a semiconductor chip.

In the case of a semiconductor chip forming a logic LSI having a number of external connecting terminals (pins), bonding pads with bump electrodes to be respectively formed thereon are ordinarily disposed along the four sides of the chip. In the case of a memory LSI in which the number of pins is relatively small, however, bonding pads are disposed along one side or in the central portion of a chip. A method of concentratingly arranging the bonding pads along one side of the chip is called a one-side pad arrangement system, which is advantageous in that the chip size is reducible.

Nevertheless, there arises the following problem if a semiconductor chip employing the one-side pad arrangement system is packaged in the TCP.

When each lead is connected via the bump electrode onto the bonding pad of the semiconductor chip of the one-side pad arrangement system, the application of a potting resin onto the semiconductor chip in such a state that the semiconductor chip is supported in the device hole of an insulating tape only by the leads connected to the respective bonding pads disposed on one side thereof causes the semiconductor chip to tilt because of the weight of the resin. When the potting resin is cured, the packaging of TCP cannot be uniformized because part of the film thickness is undesirably increased.

In this case when the potting resin is applied onto the semiconductor chip in which a state that it is placed on, for example, a horizontal stage in order to prevent the semiconductor chip from being tilted (displaced) in this case, the potting resin passed through the gap between the insulating tape and the semiconductor chip tends to stick to the back of the semiconductor chip and the surface of the stage. In consequence, workability at the step of encapsulation with resin is extremely lowered.

An object of the present invention is to provide a technology of making uniform the thickness of a TCP in use in packaging a semiconductor chip of a one-side pad arrangement system.

Another object of the present invention is to provide a technology of improving the workability of assembling a TCP for use in packaging a semiconductor chip of a one-side pad arrangement system.

These and other objects and novel features of the invention may be readily ascertained by referring to the following description and appended drawings.

A brief description will be given of the representative of the inventions disclosed in the present patent application.

(1) A semiconductor device according to the present invention comprising a tape carrier package in which a semiconductor chip is placed in the device hole of an insulating tape which is formed with a plurality of leads on the major surface of the semiconductor chip; one ends of the leads are electrically connected onto a plurality of bonding pads which are disposed in an uneven manner in a predetermined area of the major surface of the semiconductor chip; and the major surface of the semiconductor chip and one ends of the leads are at least encapsulated with resin, is characterized in that dummy bonding pads in an electrically floating state are disposed in an area different from the area where the bonding pads on the major surface of the semiconductor chip are disposed; and one ends portion of dummy leads which are formed on one side of the insulating tape are connected onto the corresponding dummy bonding pads.

(2) A semiconductor device according to the present invention in which the plurality of the bonding pads are disposed along one side of the semiconductor chip; and the bonding pads are disposed along the other opposed side of the semiconductor chip.

(3) A semiconductor device according to the present invention in which some dummy leads extending to the portion over the gap between the semiconductor chip and the insulating tape are disposed in an area along one side opposite to the one side where the bonding pads of the semiconductor chip are disposed.

(4) A semiconductor device according to the present invention in which some dummy leads extending to the portion over the gap between the semiconductor chip and the insulating tape are disposed in areas along three sides other than the other side where the bonding pads of the semiconductor chip are disposed.

(5) A semiconductor device according to the present invention in which the plurality of the bonding pads are disposed in areas along the three sides of the semiconductor chip; and the dummy bonding pads are disposed in an area along the other side of the semiconductor chip.

(6) A semiconductor device according to the present invention in which the other ends of the leads electrically connected to the bonding pads are extended outside the resin for encapsulating the semiconductor chip so that the other ends of the leads are capable of being packaged.

(7) A semiconductor device according to the present invention in which the other ends of the dummy leads are extended outside the resin for encapsulating the semiconductor chip so that the other ends of the leads are capable of being packaged.

(8) A semiconductor device according to the present invention in which the tape carrier package is mounted on a printed wiring board.

(9) A semiconductor device according to the present invention in which a plurality of the tape carrier packages are stacked on a printed wiring board.

(10) A semiconductor device according to the present invention in which a protective frame is provided around the insulating tape.

(11) A semiconductor device according to the present invention in which the semiconductor chip is encapsulated with bonding resin.

(12) A semiconductor device according to the present invention in which a flash memory is formed on the major surface of the semiconductor chip.

(13) A semiconductor device according to the present invention in which the plurality of the bonding pads are disposed in the substantially central portion of the major surface of the semiconductor chip.

(14) A semiconductor device according to the present invention in which an IC card is loaded with a printed wiring board on which the semiconductor device is mounted.

(15) A process for producing a semiconductor device of the present invention comprises the steps of:

(a) preparing an insulating tape having at least a plurality of leads including dummy leads which are formed on its major surface, and a semiconductor chip having a plurality of bonding pads which are disposed in an uneven manner in a predetermined area on its major surface and dummy bonding pads in an electrically floating state which are disposed in an area different from the area where the bonding pads are disposed;

(b) placing the semiconductor chip in the device hole of the insulating tape, electrically connecting one end portions of the leads to the corresponding bonding pads and connecting one end portions of the dummy leads to the corresponding dummy bonding pads; and (c) at least encapsulating the major surface of the semiconductor chip and one end portions of the leads with resin.

(16) A process for producing a semiconductor device according to the present invention in which the semiconductor chip is encapsulated by curing the potting resin deposited on the major surface of the semiconductor chip.

DESCRIPTION OF THE PREFERRED EMBODIMENTS

A detailed description of the preferred embodiments of the present invention will now be described in conjunction with the drawings.

(Embodiment 1)

Figure 1:
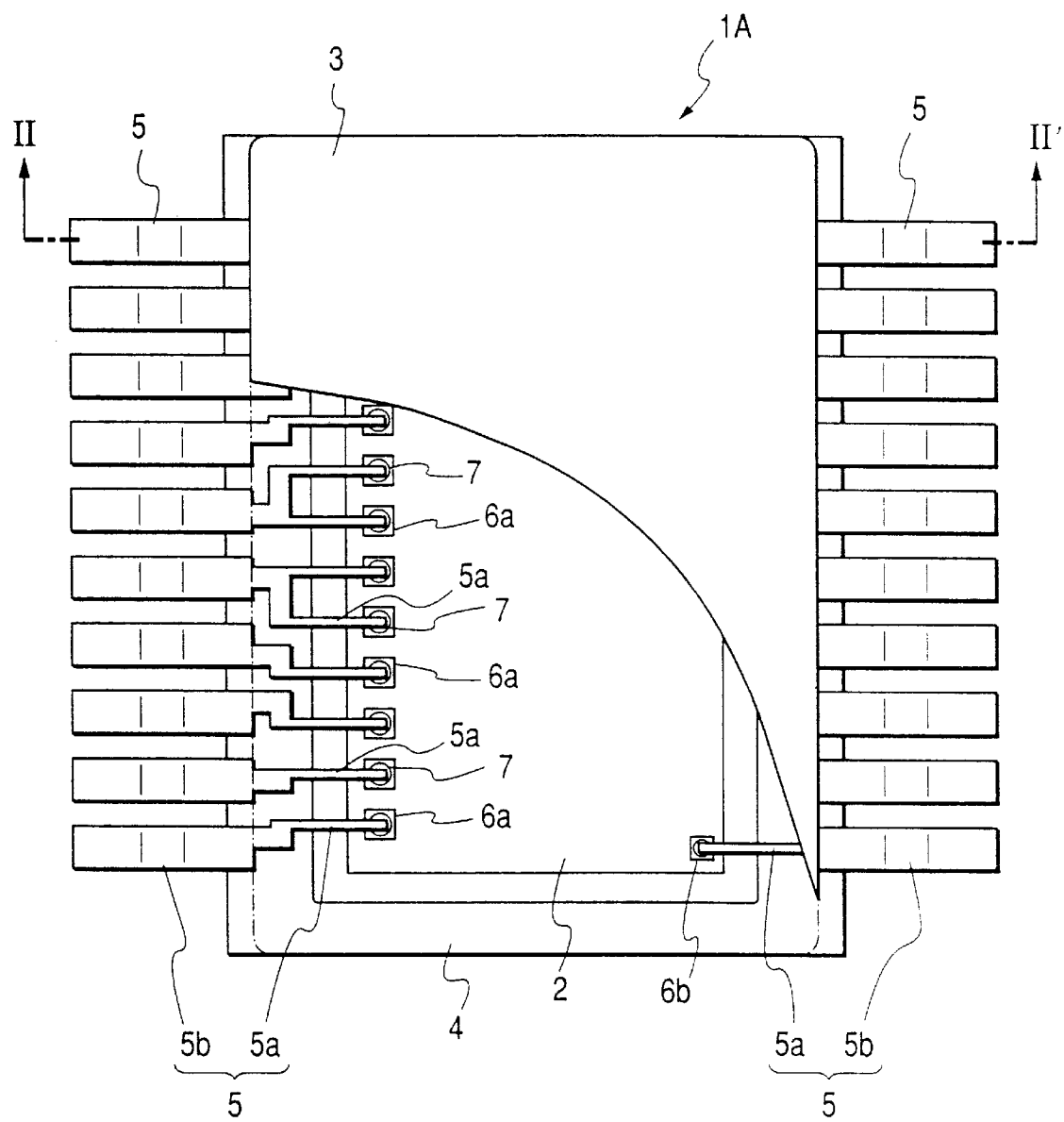
FIG. 1 is a plan view of a semiconductor device of Embodiment 1 according to the present invention.
Figure 2:
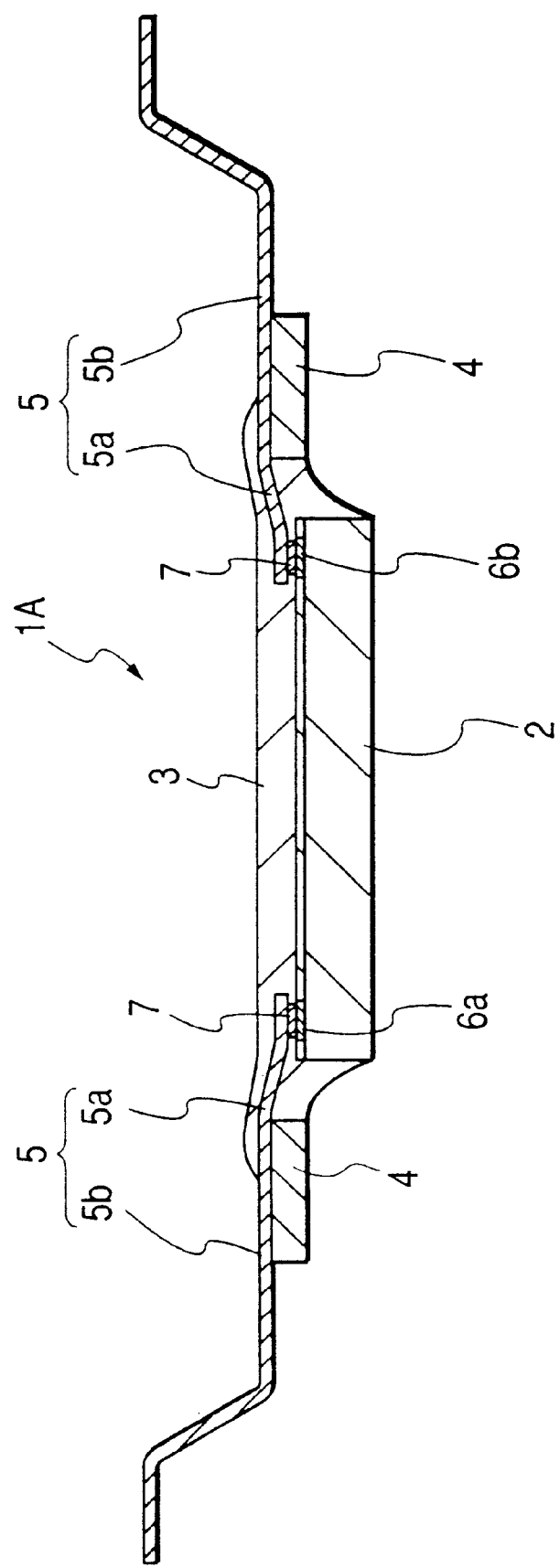
FIG. 2 is a sectional view taken on line II-II' of FIG. 1.

FIG. 1 is a plan view of a semiconductor device (TCP) of this embodiment according to the present invention, and FIG. 2 is a sectional view taken on line II—II of FIG. 1. Incidentally, the illustration of part of the resin for encapsulating a semiconductor chip is omitted in order to make the internal structure of the package easily understandable.

A TCP 1A of this embodiment according to the present invention comprises a semiconductor chip 2 of single crystal silicon having a rectangular plane shape, a potting resin 3 for encapsulating the major surface (element forming surface) and side faces of the semiconductor chip 2, and a plurality of leads 5 formed on one side of an insulating tape 4, one end portion (inner lead portion 5a) on each lead 5 and the semiconductor chip 2 being electrically connected via a bump electrode 7 of Au (gold) formed on the bonding pad 6a on the major surface of the semiconductor chip 2.

The potting resin 3 is epoxy resin, for example, and the insulating tape 4 is made of polyimide, for example. The lead 5 is formed of Cu foil and its surface of the inner lead portion 5a is plated with Au/Ni, Sn or solder, for example. Further, the other end portion (outer lead portion 5b) of the lead 5 forming the external connection terminal of the TCP 1A is in the form of a gull wing and its surface is also plated with Au/Ni, Sn, solder or the like.

Figure 3:
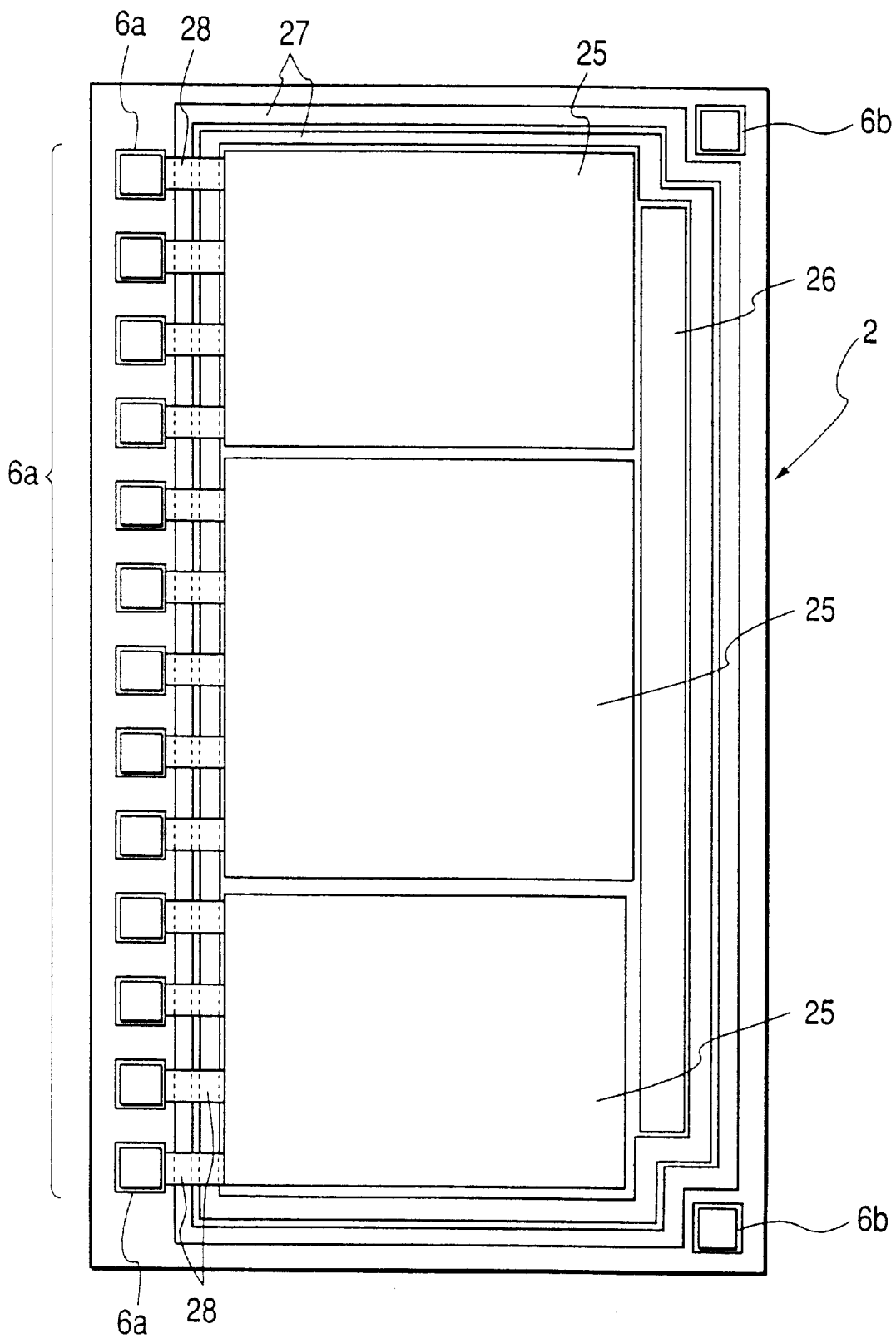
FIG. 3 is an enlarged plan view of a semiconductor chip packaged in the semiconductor device of Embodiment 1 according to the present invention.

FIG. 3 is an enlarged plan view of the major surface of the above-described semiconductor chip 2. As shown in FIG. 3, circuit portions 25 are disposed on the major surface of the semiconductor chip 2, a memory array and a peripheral circuit of, for example, a flash memory being formed in the circuit portion. In the peripheral area of the chip adjacent to the circuit portions 25 are a redundancy circuit 26, power supply wiring 27 for supplying operating voltage to the circuit portions, and a plurality of bonding pads (effective pins) 6a electrically connected to the circuit portions via the internal wiring 28. The circuit portions 25 occupy the most portion of the major surface of the semiconductor chip 2 excluding those in which the bonding pads 6a are formed. The bonding pads 6a including signal pads used for input-output signals, control signals and the like, and power supply pads connected to the power supply wiring 27. The bonding pads 6a for supplying power are provided in both side end portions of the chip, for example.

The plurality of bonding pads 6a are arranged in a row along one (the left-hand side of FIG. 3) of the long sides opposite to each other on the semiconductor chip 2. In other words, a so-called one-side pad arranging system for locally arranging the bonding pads 6a along the one side is employed for the semiconductor chip 2. The one-side pad arranging system is advantageous in that the chip size is reducible in comparison with a method of arranging bonding pads 6a along two sides or four sides of such a semiconductor chip 2.

Bonding pads (dummy pads) 6b in a floating state are arranged in the respective corner portions of the other long side (the right-hand side of FIG. 3) of the semiconductor chip 2. These dummy pads 6b are intended to prevent the insulating tape 4 from positionally shifting from the semiconductor chip 2 during the process of producing the TCP 1A as will be described later.

Figure 4:
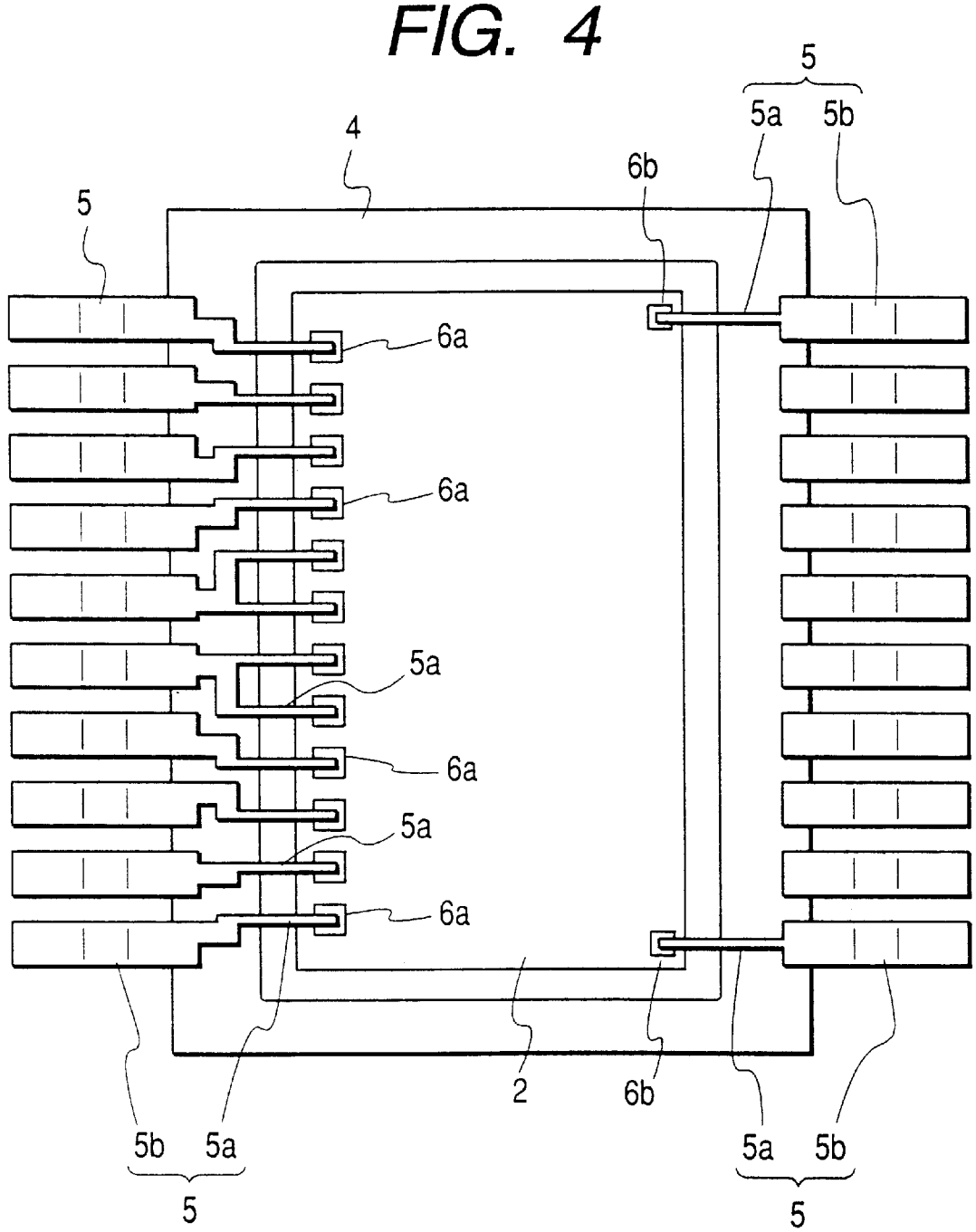
FIG. 4 is a plan view showing an arrangement of leads in the semiconductor device of Embodiment 1 according to the present invention.

FIG. 4 is a plan view showing an arrangement of leads 5 corresponding to the bonding pads (effective pins) 6a and the dummy pad 6b. Although the same number of leads 5 is disposed on both two long sides of the semiconductor chip 2, the leads 5 disposed on the long side with the dummy pads 6b are dummy leads which do not function as the external connection terminals of the TCP 1A. Of these dummy leads 5, each of the leads 5 near the dummy pads 6b is provided with the inner lead portion 5a and its leading end is bonded to the dummy pad 6b and used to support the semiconductor chip 2. The other dummy leads 5 are constituted of not the inner lead portions 5a but only the outer lead portions 5b, respectively. The outer lead portions 5b of these dummy leads 5 are, as will be described later, used as support members for stably mounting the TCP 1A on the printed wiring board.

A description will subsequently be given of a process for producing the TCP 1A of this embodiment according to the present invention with reference to FIGS. 5–15.

Figure 5:
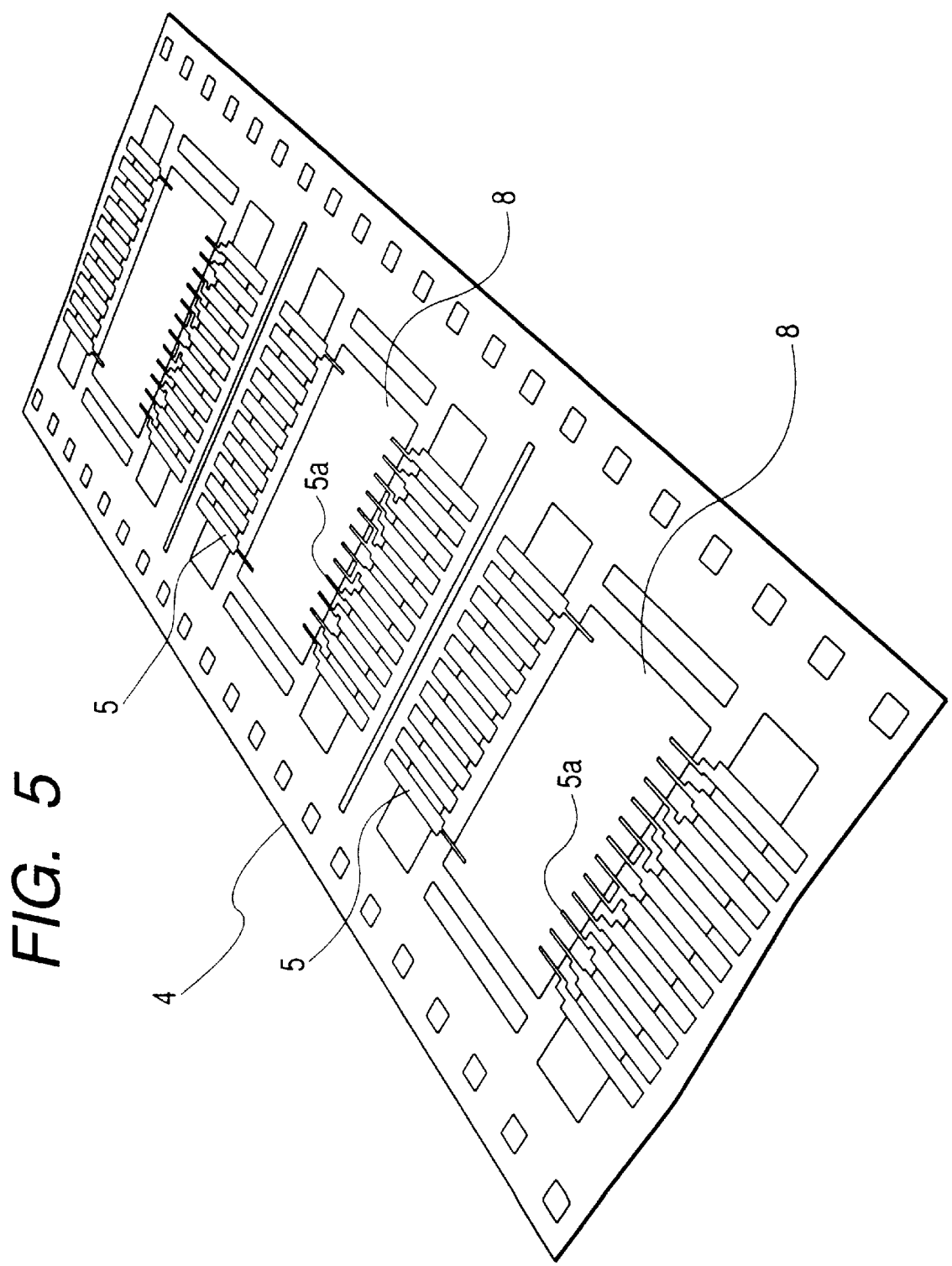
FIG. 5 is a perspective view showing a process for producing the semiconductor device of Embodiment 1 according to the present invention.
Figure 6:
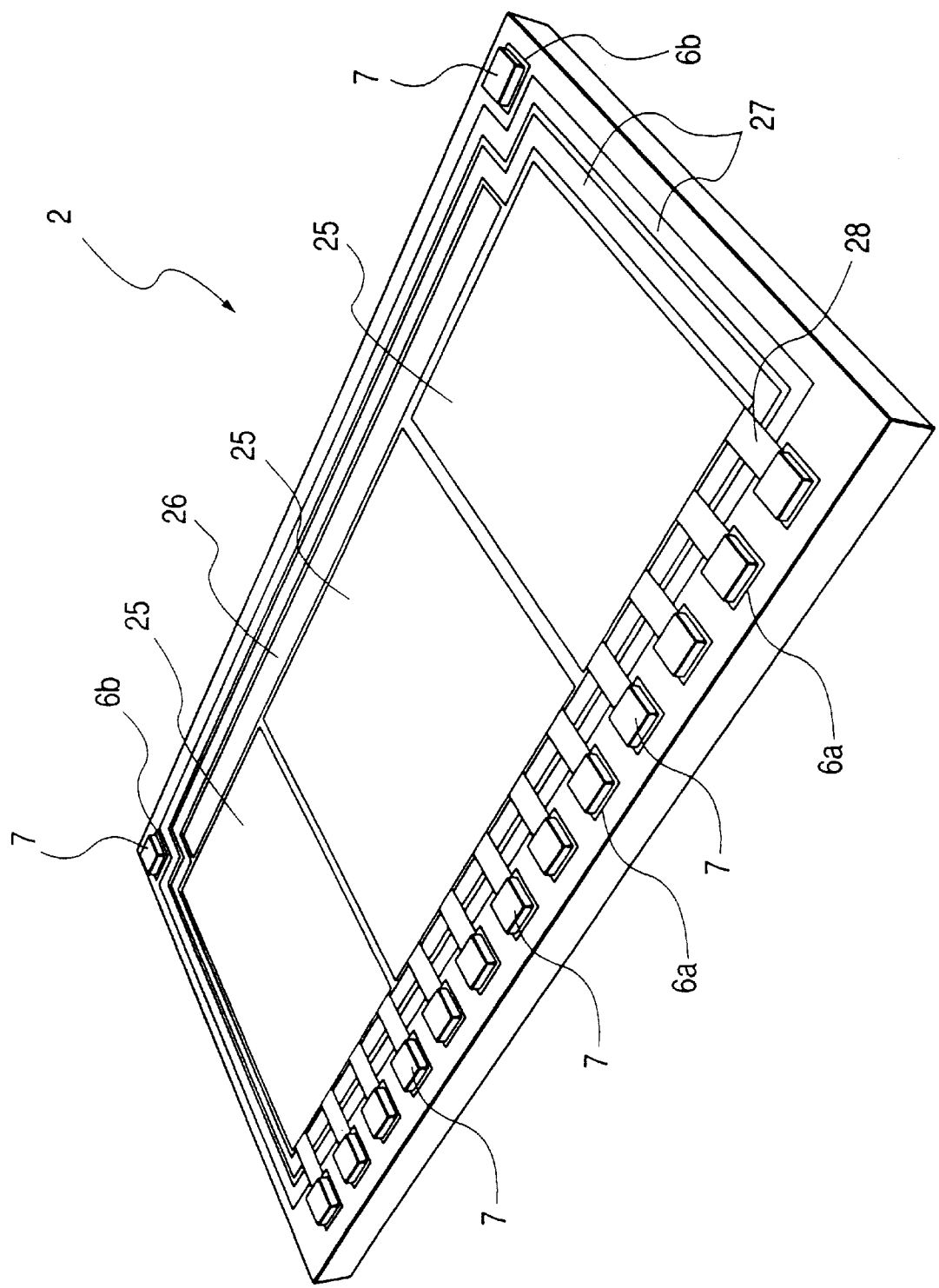
FIG. 6 is a perspective view showing a process for producing the semiconductor device of Embodiment 1 according to the present invention.

In order to manufacture the TCP 1A, the insulating tape 4 shown in FIG. 5 and the semiconductor chip 2 shown in FIG. 6 are prepared.

The insulating tape 4 is made of polyimide about 50 $\mu$m thick and has a rectangular device hole 8 where the semiconductor chip 2 is placed. In the areas along the two long sides of the device hole 8, the leads 5 formed by etching thin Cu foil that is bonded onto one side of the insulating tape 4 and their inner lead portions 5a are extended into the device hole 8. The insulating tape 4 is actually a long tape about 10 meters long, only part of the tape (equivalent to three TCPs) is shown in FIG. 5.

The bump electrodes 7 are formed on the bonding pads 6a and dummy pads 6b of the semiconductor chip 2 before the TCP 1A is assembled. In order to form the bump electrode 7, a wire bonding tool, for example, is used to bond an Au ball on the bonding pad 6a and the dummy pad 6b and then the surface of each Au ball is flattened by means of a pressure-bonding tool.

Figure 7:
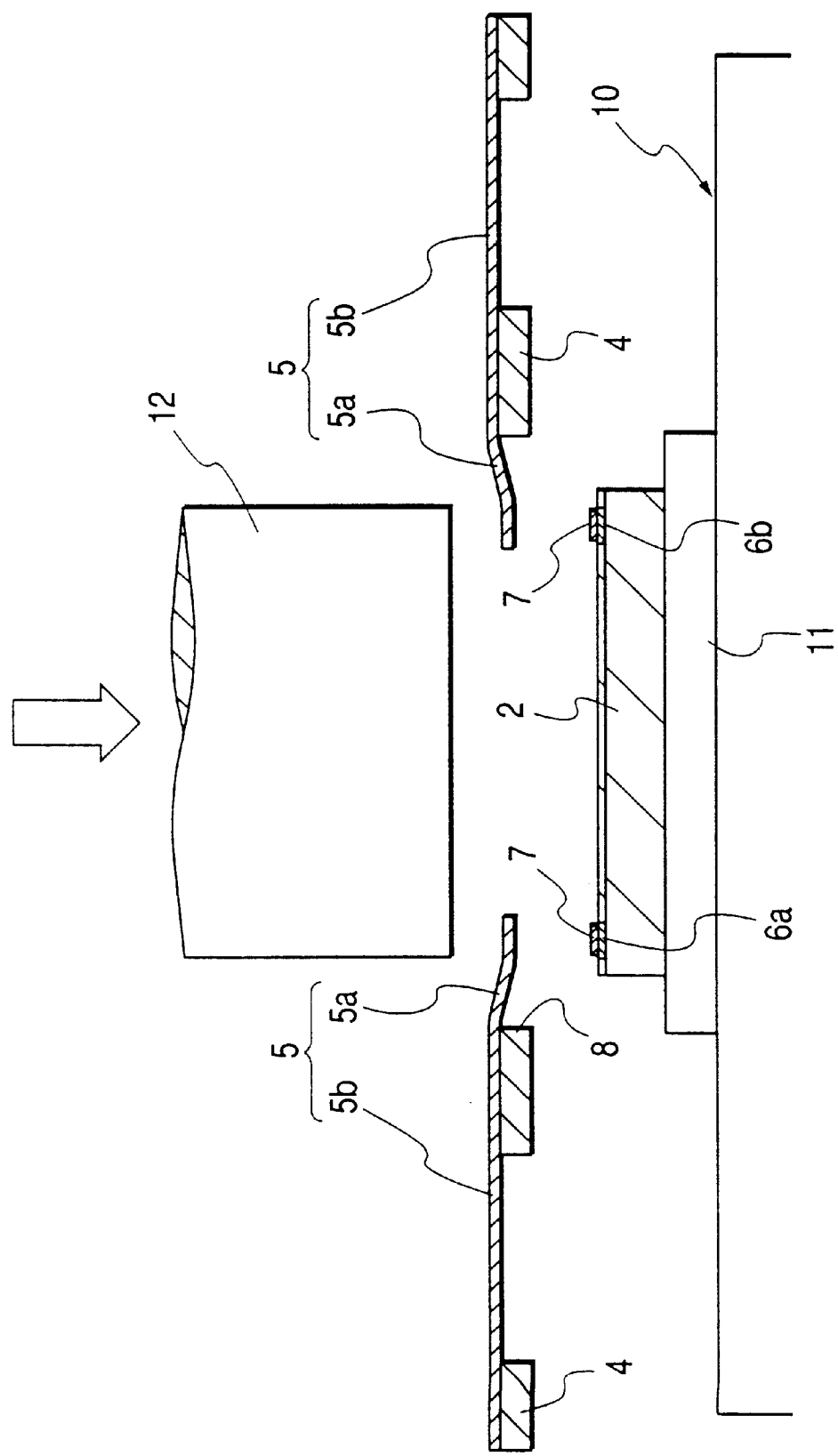
FIG. 7 is a sectional view showing a process for producing the semiconductor device of Embodiment 1 according to the present invention.
Figure 8:
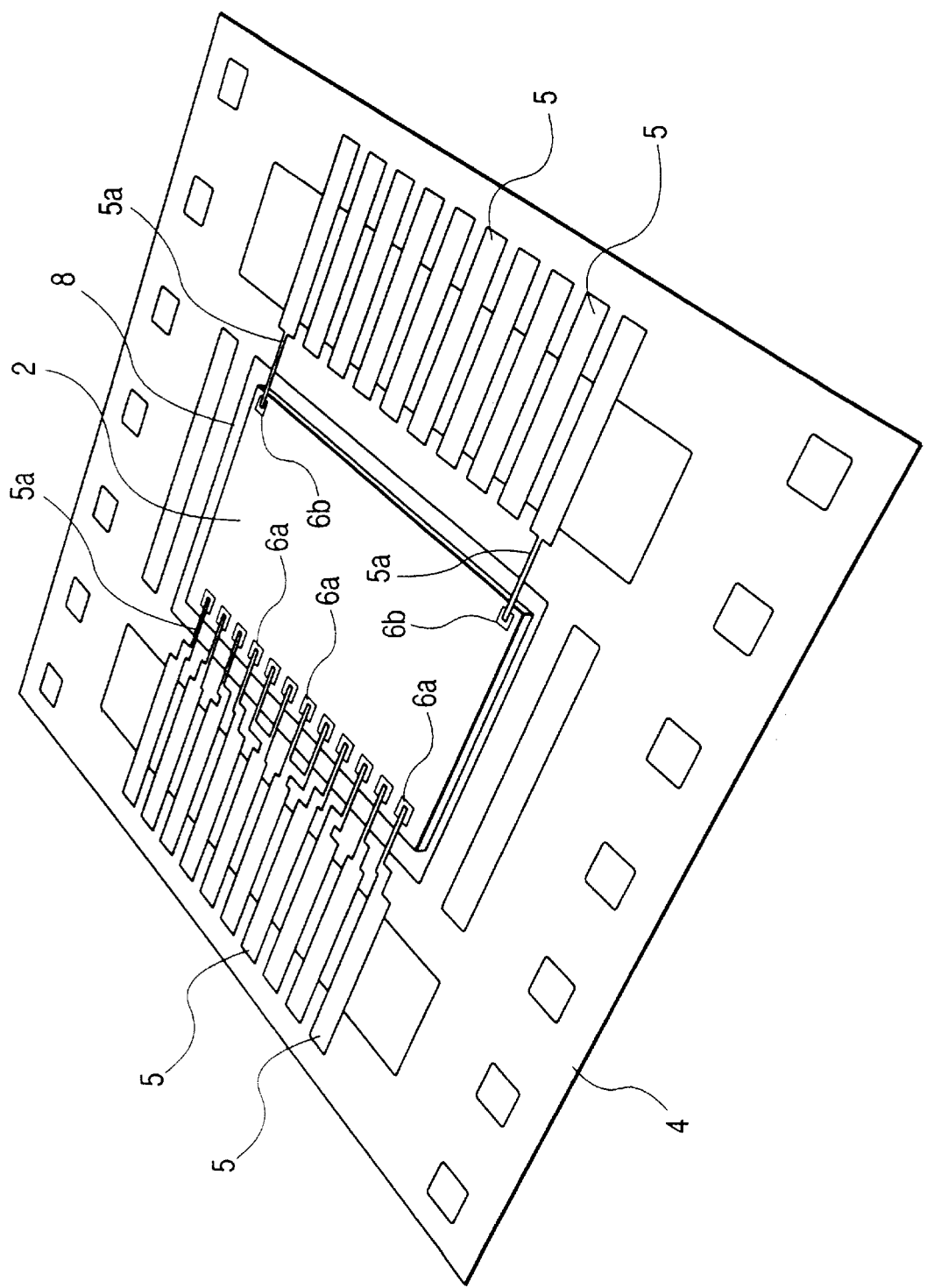
FIG. 8 is a perspective view showing a process for producing the semiconductor device of Embodiment 1 according to the present invention.

Subsequently, the semiconductor chip 2 is, as shown in FIG. 7, placed on the stage 11 of an inner lead bonding tool 10 and heated at about 100° C. and after the inner lead portions 5a are respectively made opposite to the bump electrodes 7 by positioning the device hole 8 of the insulating tape 4 right above the semiconductor chip 2, a bonding tool 12 which is heated to about 500° C. is brought into pressure contact with the inner lead portions 5a for about one second, whereby as shown in FIG. 8, the inner lead portions 5a of all leads 5 are all simultaneously bonded onto the corresponding bonding pads 6a (or the dummy pads 6b).

Figure 9:
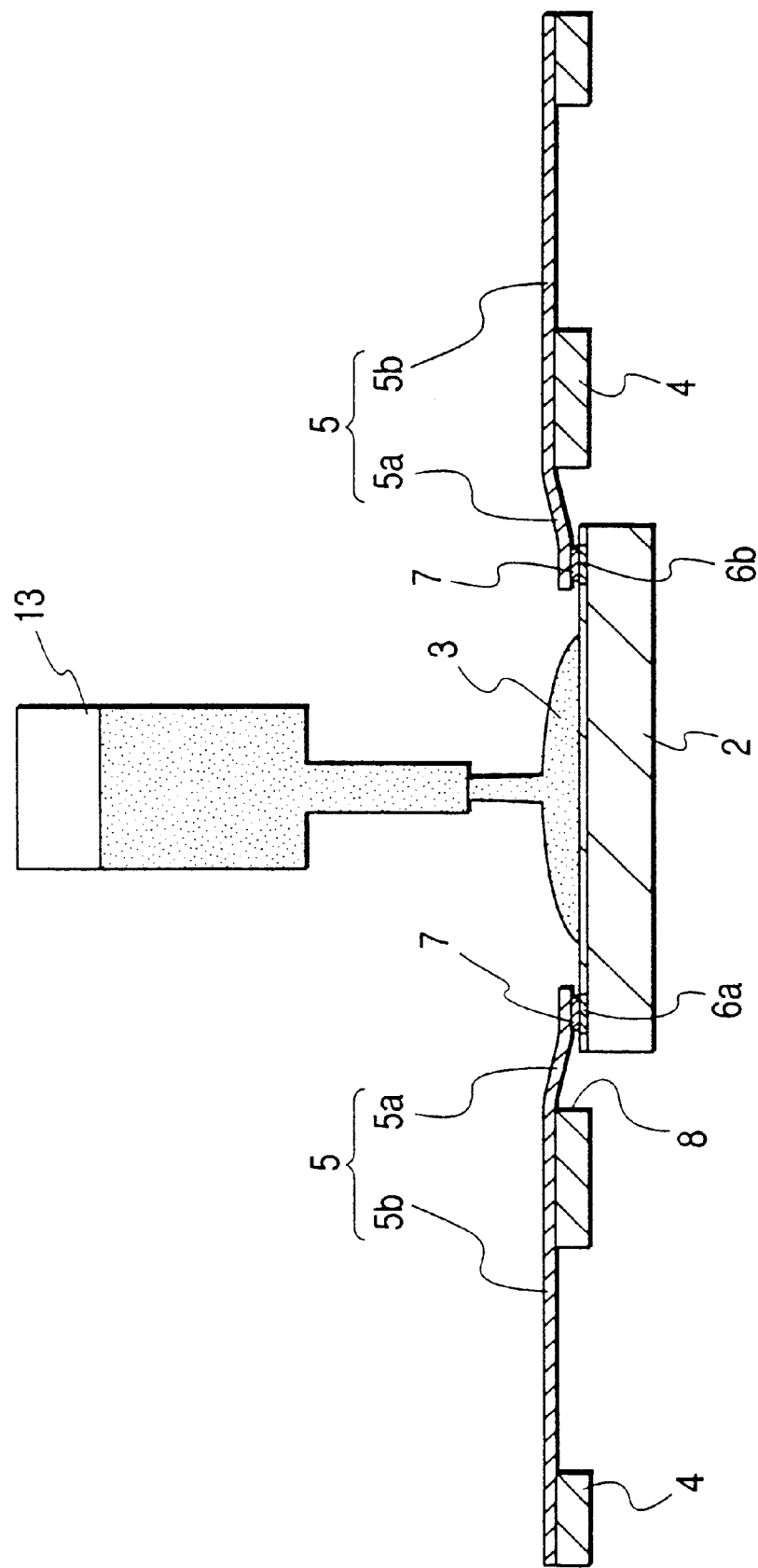
FIG. 9 is a sectional view shoeing a process for producing the semiconductor device of Embodiment 1 according to the present invention.
Figure 10:
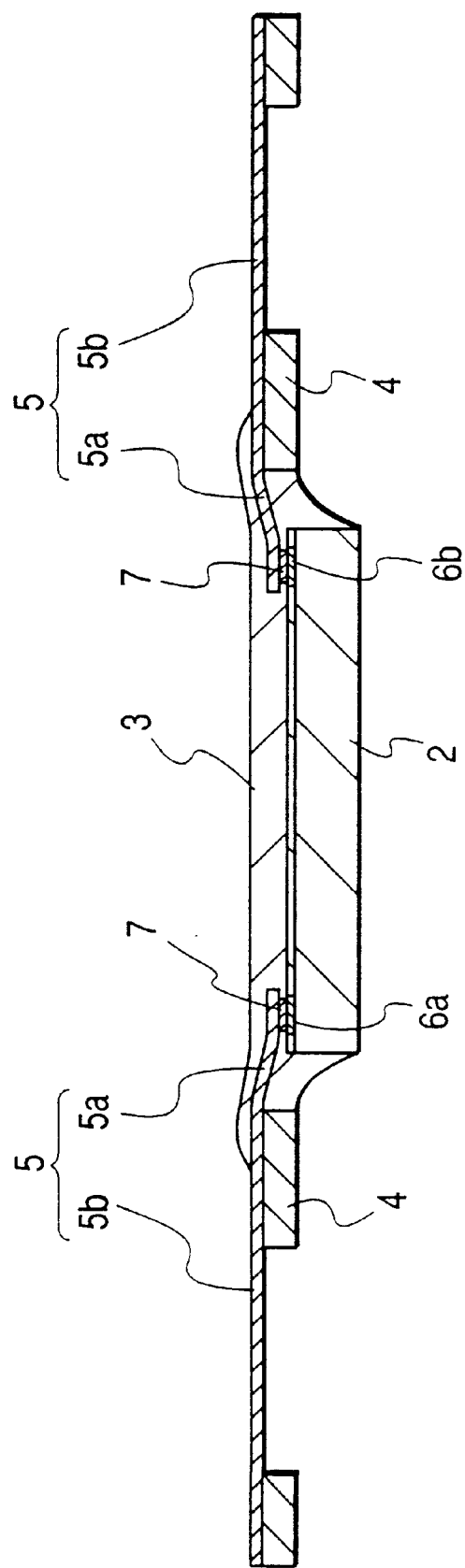
FIG. 10 is a sectional view showing a process for producing the semiconductor device of Embodiment 1 according to the present invention.

As shown in FIG. 9, further, a dispenser 13 is used to apply the potting resin 3 diluted with thinner to the major surface of the semiconductor chip 2. Part of the potting resin 3 applied to the major surface of the semiconductor chip 2 is passed through the gap between the insulating tape 4 and the semiconductor chip 2 before being deposited on the side faces of the semiconductor chip 2. Thus, the major surface and side faces of the semiconductor chip 2 are encapsulated with the potting resin 3 as shown in FIG. 10 by cutting the potting resin 3 through heat treatment.

Figure 11:
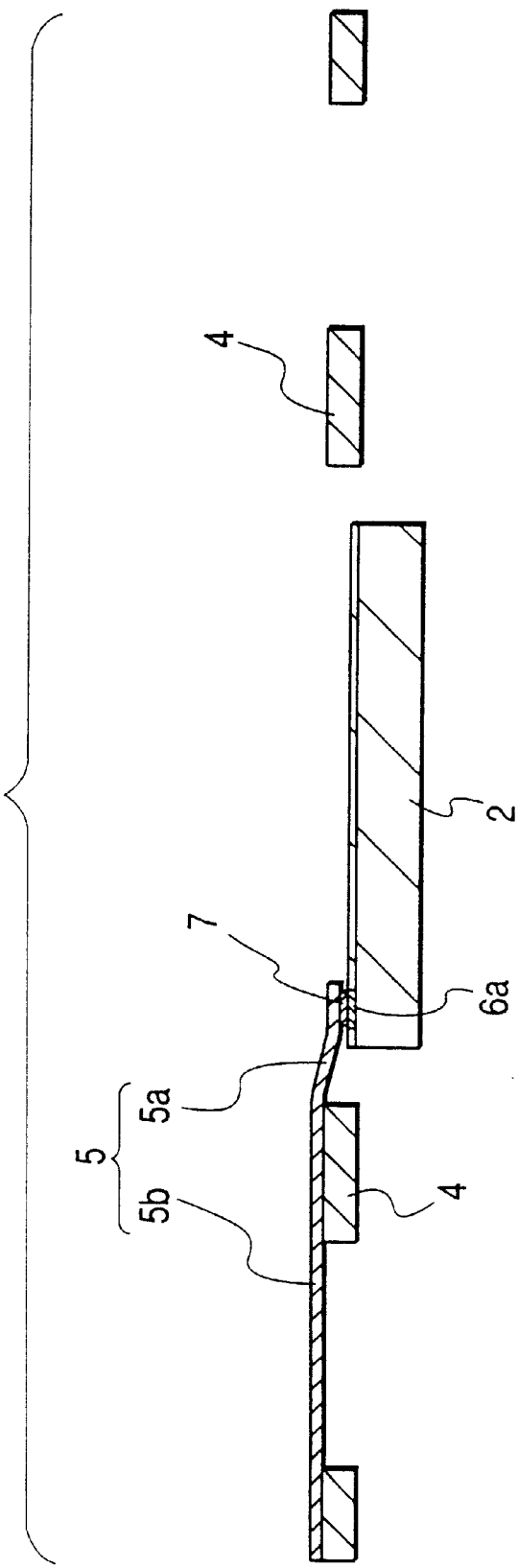
FIG. 11 is a sectional view showing a process for producing the semiconductor device of Embodiment 1 according to the present invention.
Figure 12:
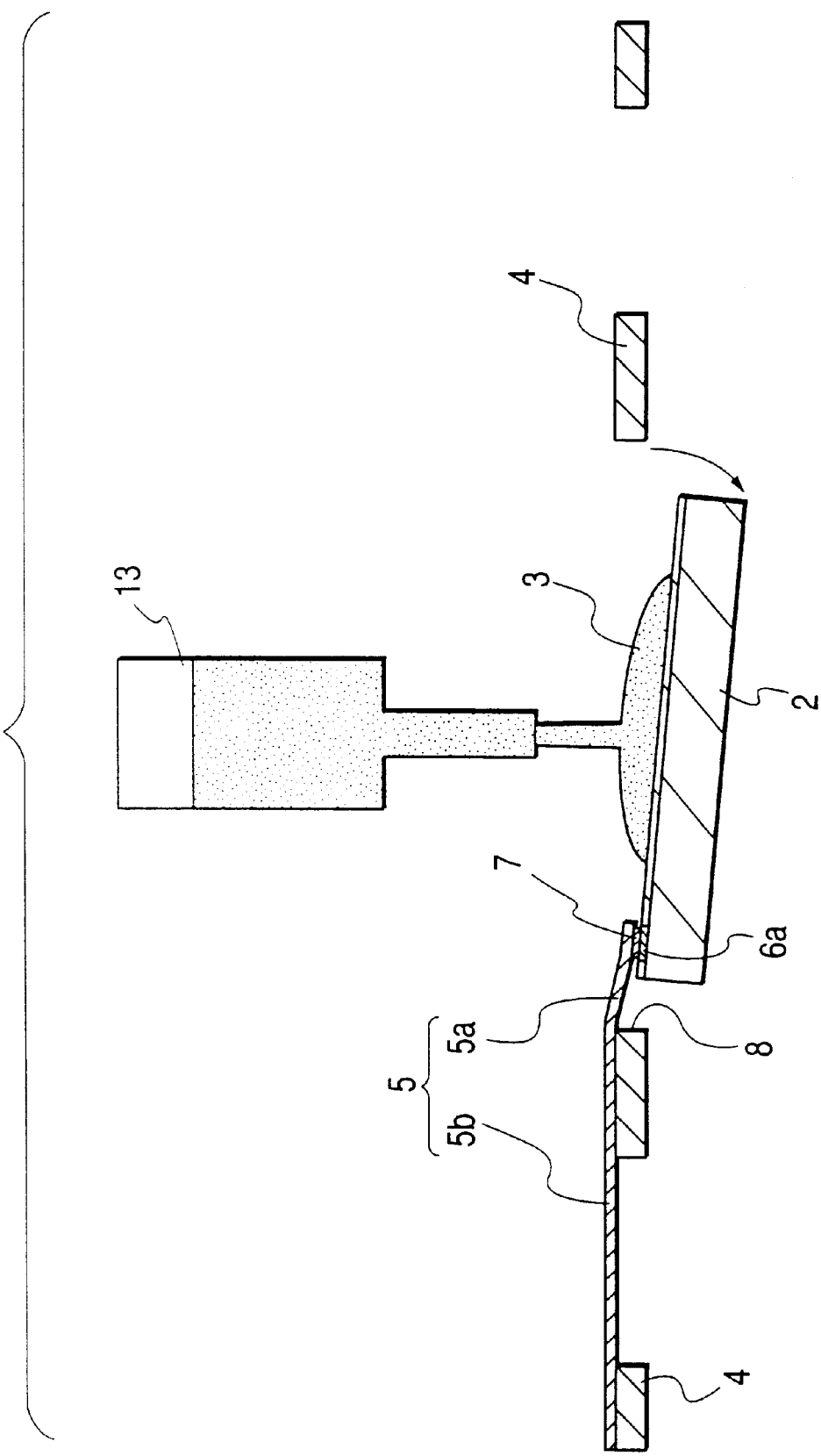
FIG. 12 is a sectional view showing a process for producing the semiconductor device of Embodiment 1 according to the present invention.
Figure 13:
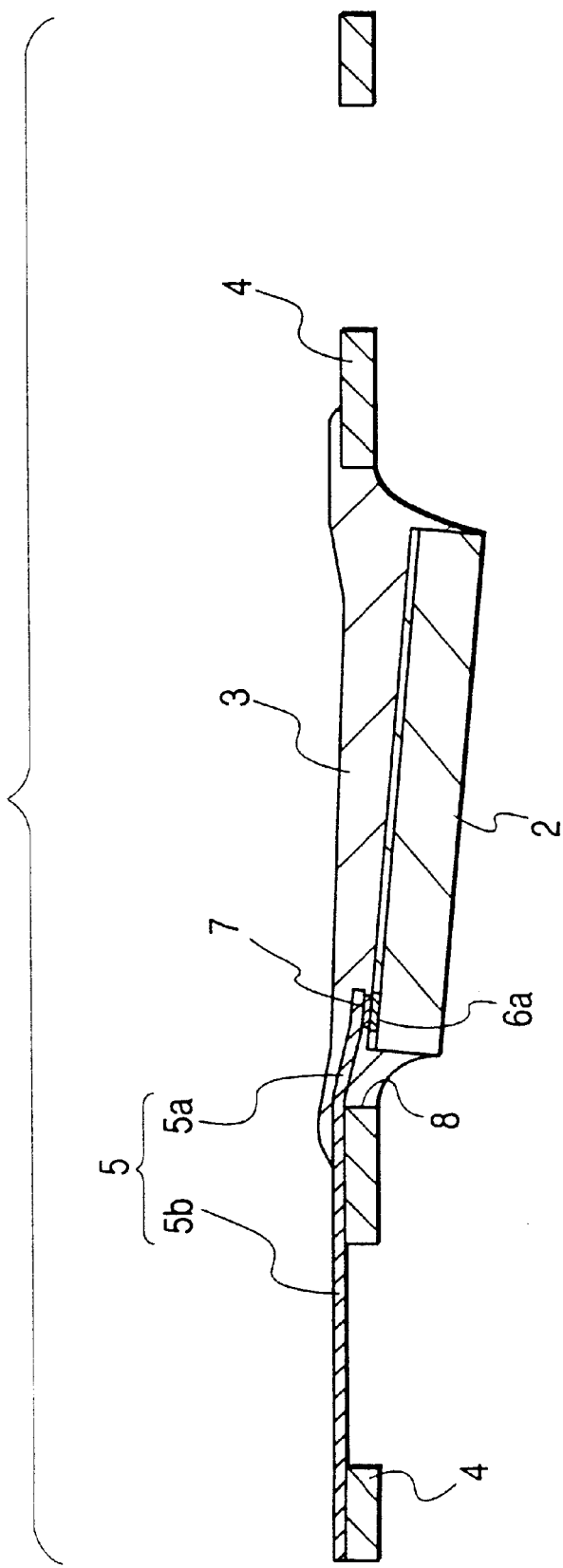
FIG. 13 is a sectional view showing a process for producing the semiconductor device of Embodiment 1 according to the present invention.
Figure 14:
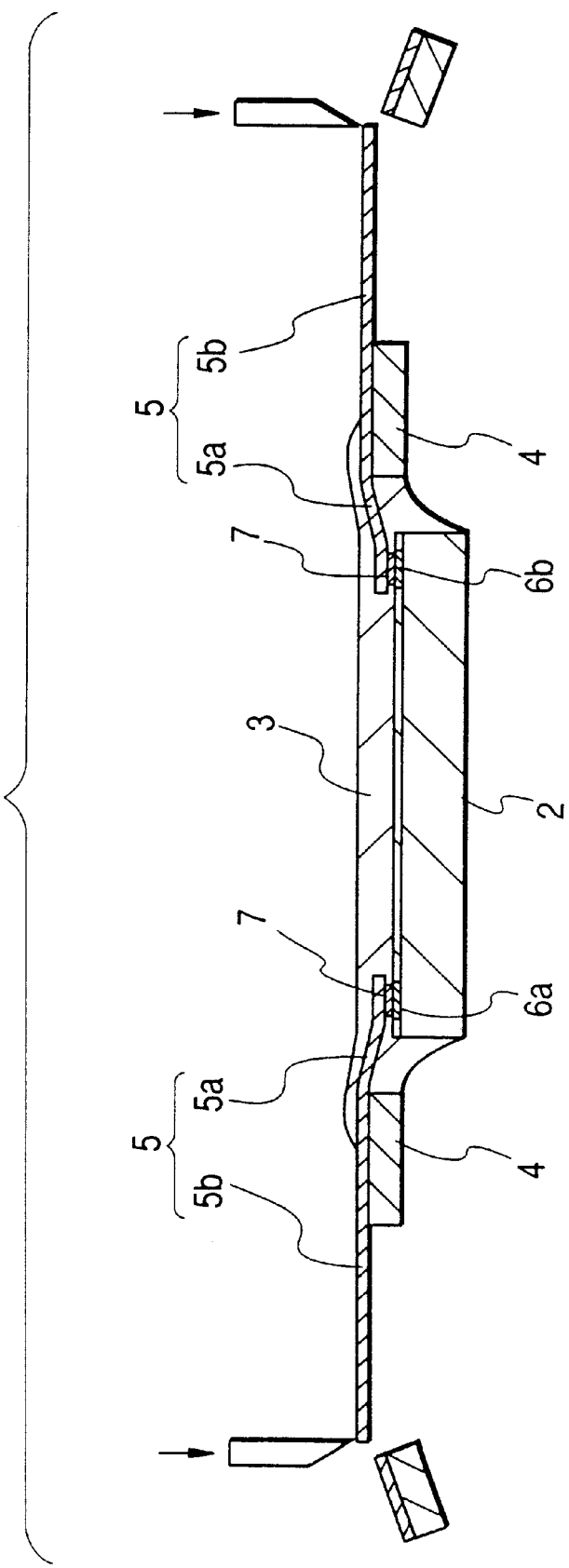
FIG. 14 is a sectional view showing a process for producing the semiconductor device of Embodiment 1 according to the present invention.

In a case where the semiconductor chip 2 is not provided with the dummy pads 6b when the semiconductor chip 2 is encapsulated with resin through the above-described steps according to the one-side pad arranging system in which the bonding pads 6a (effective pins) 6a are localized on one side, the semiconductor chip 2 is, as shown in FIG. 11, supported by only the inner lead portions 5a of the leads 5 connected to the respective bonding pads 6a (effective pins). When the potting resin 3 is applied to the semiconductor chip 2 like this, the semiconductor chip 2 is caused to tilt because of the weight of the resin as shown in FIG. 12 and as shown in FIG. 13, part of the film becomes undesirably thickened, which results in that it is impossible to uniformize the thickness of the TCP 1A.

When the potting resin 3 is applied to the semiconductor chip 2 placed on the horizontal stage in order to prevent the semiconductor chip 2 from being tilted (displaced) in this case, the potting resin 3 passed through the gap between the insulating tape 4 and the semiconductor chip 2 sticks to the undersurface of the semiconductor chip 2 and the surface of the stage, thus extremely lowering the workability at the resin-encapsulating step.

In the case of the TCP 1A of this embodiment according to the present invention wherein the dummy pads 6b are disposed on the side opposite to the side on which the bonding pads 6a (effective pins) are disposed and the semiconductor chip 2 is supported by the inner lead portions 5a connected to the respective bonding pads 6a (effective pins) and the inner lead portions 5a connected to the respective dummy pads 6b to ensure that the semiconductor chip 2 is prevented from being tilted (displaced) at the resin-encapsulating step, variation in the package thickness are obviated and the yield of the TCP 1A is made improvable thereby. Thus, the semiconductor chip of the one-side pad arranging system that has been difficult to package in the TCP can easily be packaged therein, so that a range of semiconductor products employing TCPs is widened.

Figure 15:
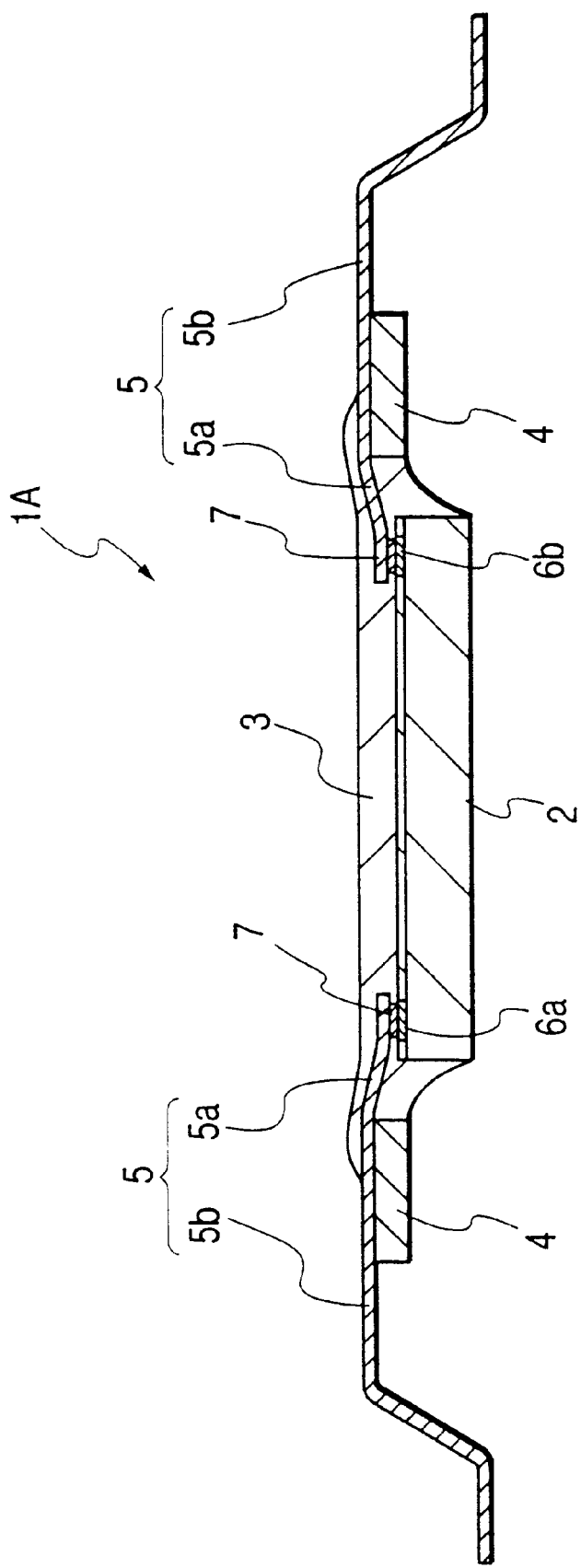
FIG. 15 is a sectional view showing a process for producing the semiconductor device of Embodiment 1 according to the present invention.
Figure 16:
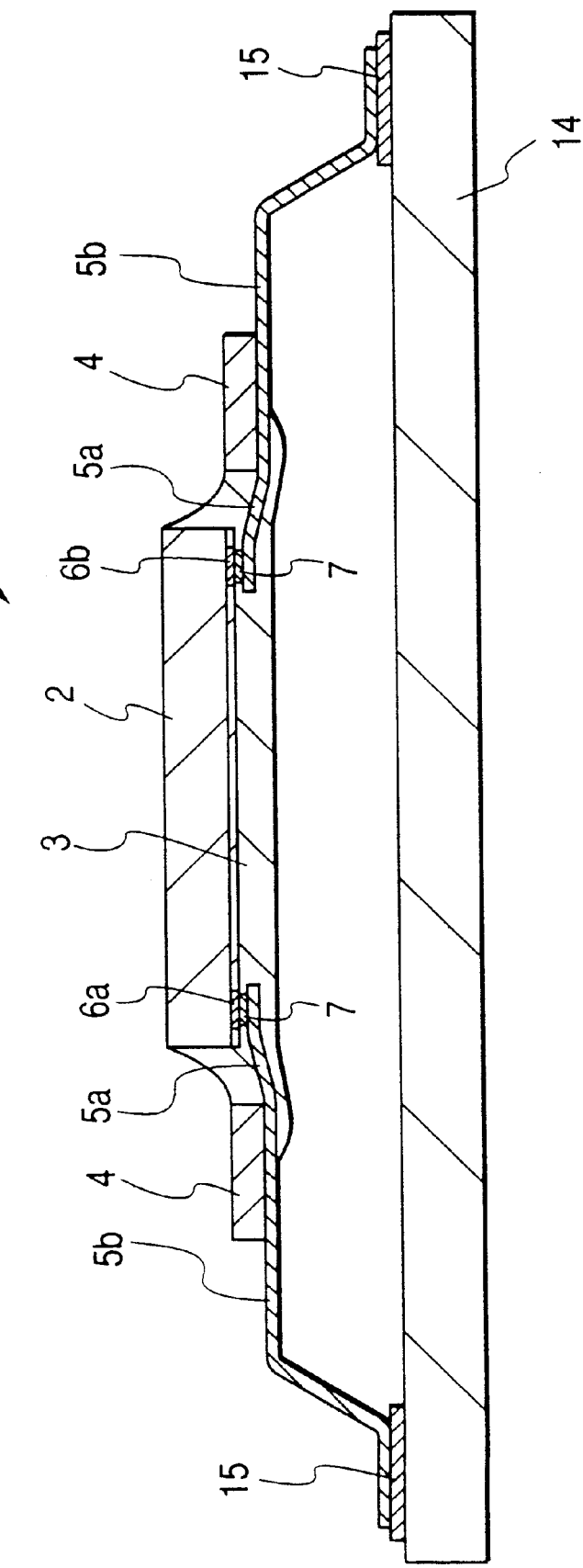
FIG. 16 is a sectional view showing a state in which the semiconductor device is mounted on a printed wiring board of Embodiment 1 according to the present invention.

Thereafter by cutting/removing unnecessary portions of the insulating tape 4 and the lead 5, and shaping the outer lead portions 5b of the leads 5, the TCP 1A shown in FIGS. 1 and 2 is completed. The outer lead portions 5b are bent toward the major surface side of the semiconductor chip 2 as shown in FIG. 2 or toward the undersurface side thereof as shown in FIG. 15.

In order to mount the TCP 1A, the outer lead portions 5b of the leads 5 are positioned on the respective electrodes 15 of a printed wiring board 14. Solder is supplied by plating or pasting onto each electrode 15 beforehand. Then the outer lead portions 5b and the electrodes 15 are electrically connected by reflowing the solder in a heating furnace.

Figure 17:
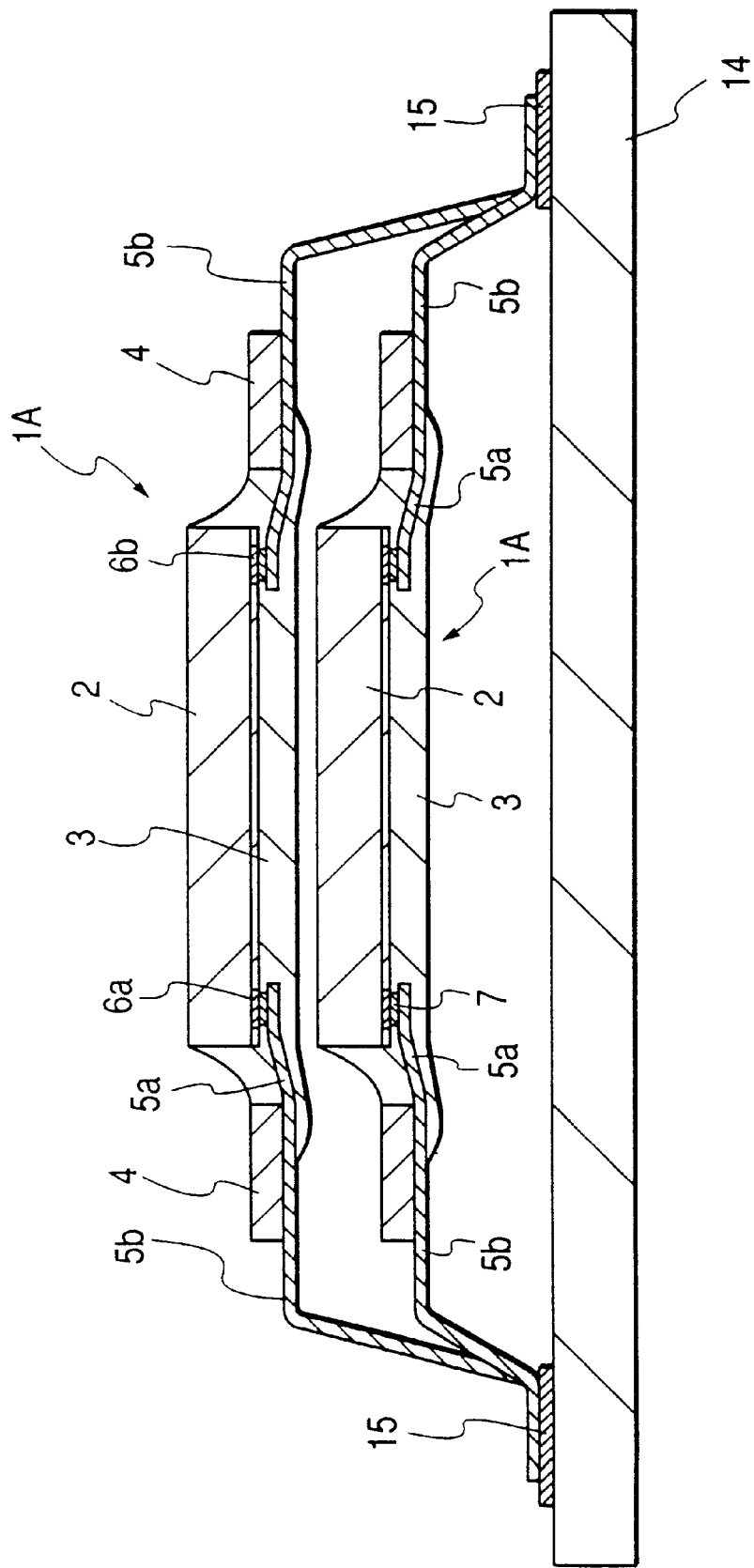
FIG. 17 is a sectional view showing a state in which the semiconductor device is mounted on a printed wiring board of Embodiment 1 according to the present invention.

Since all the leads 5 including the dummy leads are provided with the cuter lead portions 5b, the TCP 1A of this embodiment according to the present invention can be mounted on the printed wiring board 14 easily and certainly. With the TCP 1A of this embodiment according to the present invention, moreover, a stacked module is readily accomplishable by changing the bending shapes of the outer lead portions 5b for mounting purposes as shown in FIG. 17.

Figure 18:
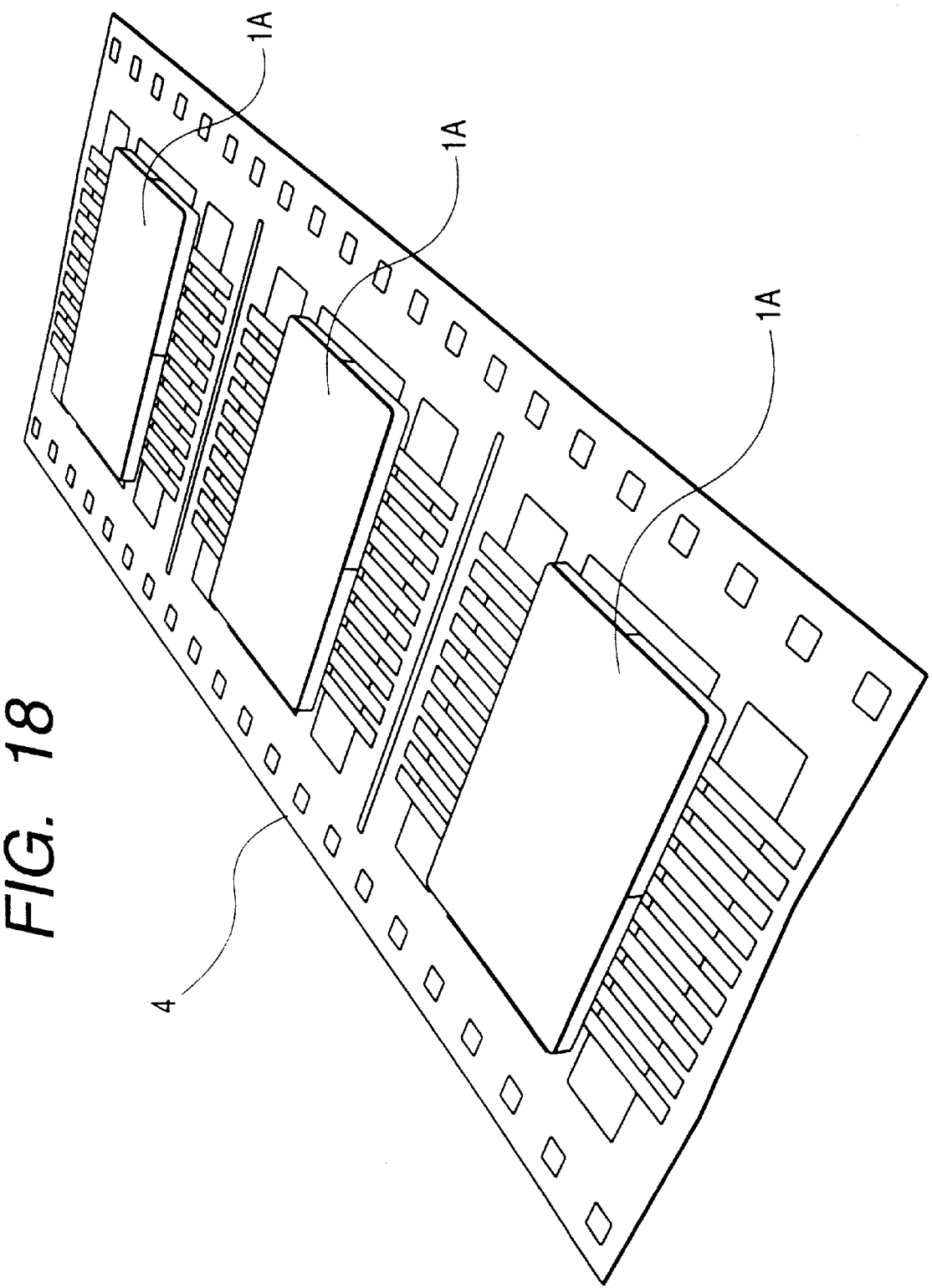
FIG. 18 is a perspective view of the semiconductor device of Embodiment 1 according to the present invention.
Figure 19:
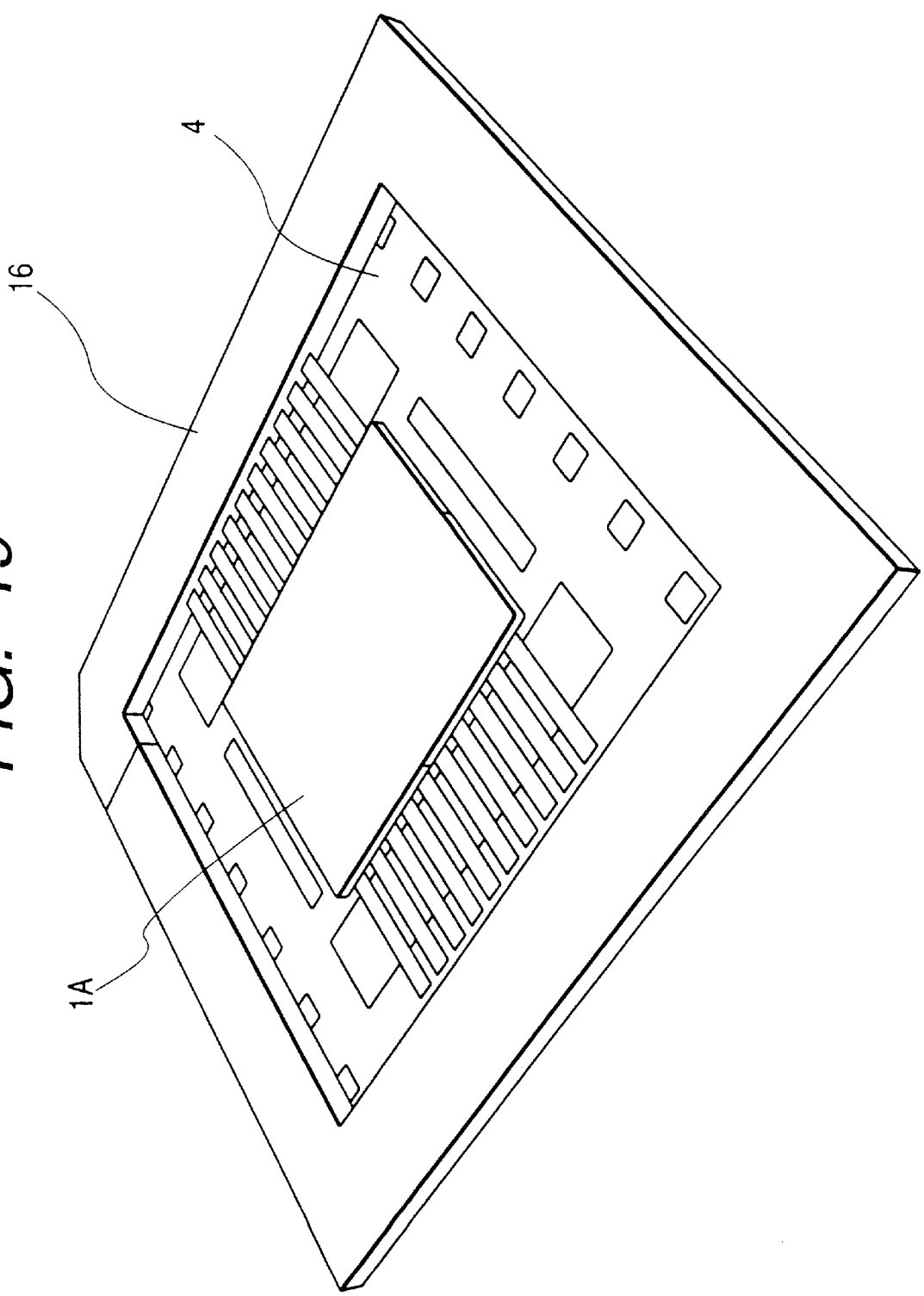
FIG. 19 is a perspective view of the semiconductor device of Embodiment 1 according to the present invention.

In addition to the case where one TCP 1A or TCPs in the stacked form are mounted on such a printed wiring board 14 at the final assembling step, the TCP may be applied to cases, where as shown in FIG. 18, a long tape is wound as it is on a reel and conveyed to another assembling line in which insulating tapes 4 and leads 5 are cut/removed, if necessary, so as to be mounted on printed wiring boards and where as shown in FIG. 19, the insulating tape 4 is cut to a size simultaneously with the provision of a protective plastic frame 16 around the insulating tape and conveyed to another assembling unnecessary portions of the insulating tape 4 and the leads 5 as well as the protective film 15 are cut/removed so that the TCP is mounted on a printed wiring board.

Figure 20:
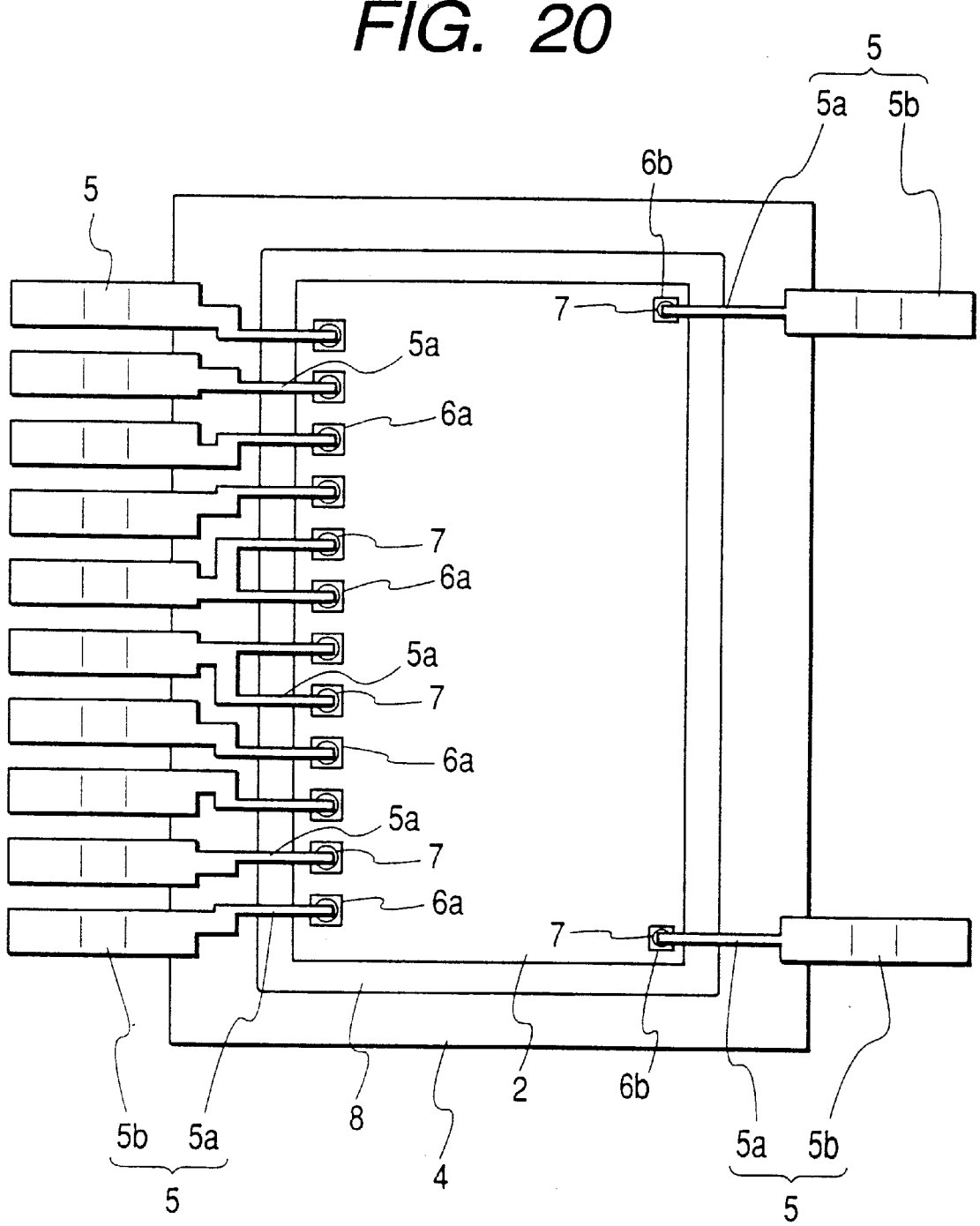
FIG. 20 is a plan view of the semiconductor device of Embodiment 1 according to the present invention.

In the TCP 1A of this embodiment according to the present invention, it is not always necessary that the number of dummy leads 5 is equal to the number of leads 5 to be connected to the bonding pads 6a (effective pins) but it may be acceptable that the number of dummy leads 5 is equal to the number of bonding pads 6a (two), for example, as shown in FIG. 20. In this case, each dummy lead 5 is provided with the outer lead portions 5b to ensure that mounted on the printed wiring board 14 is facilitated. Notwithstanding, the thermal resistance of a package is made reducible by increasing the number of leads 5 because the number of heat radiating channels from the package to the printed wiring board 14 is increased.

Figure 21:
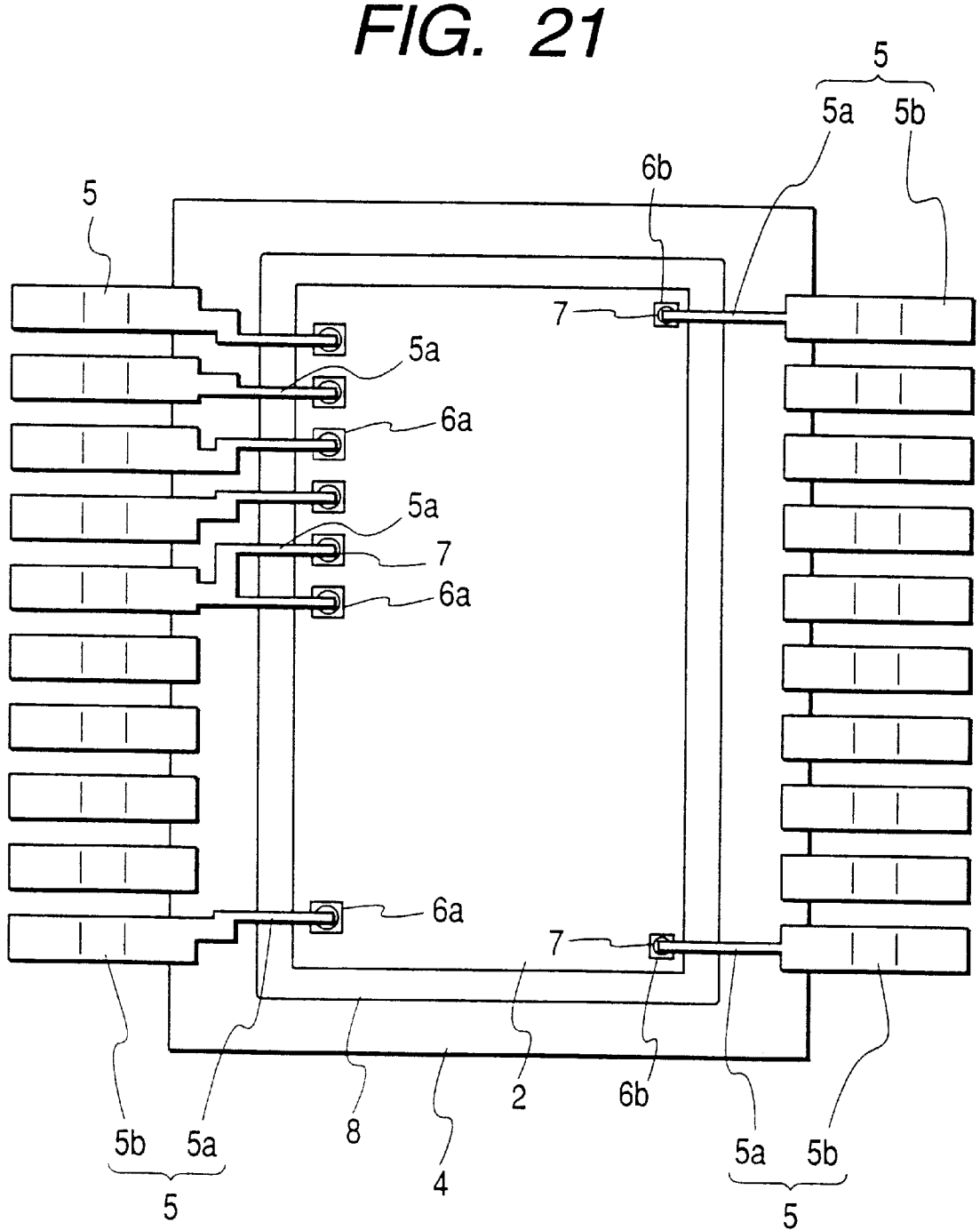
FIG. 21 is a plan view of the semiconductor device of Embodiment 1 according to the present invention.
Figure 22:
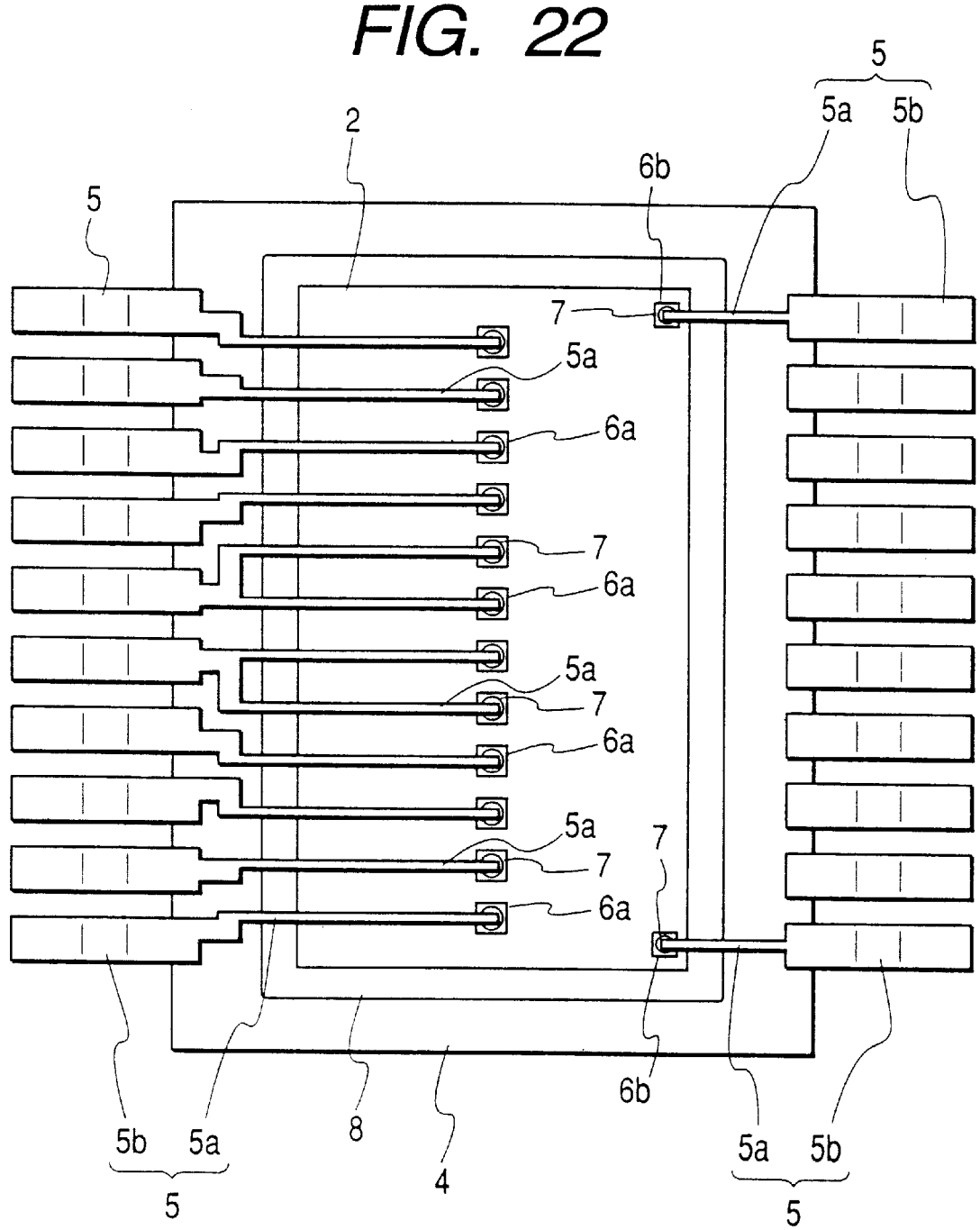
FIG. 22 is a plan view of the semiconductor device of Embodiment 1 according to the present invention.
Figure 23:
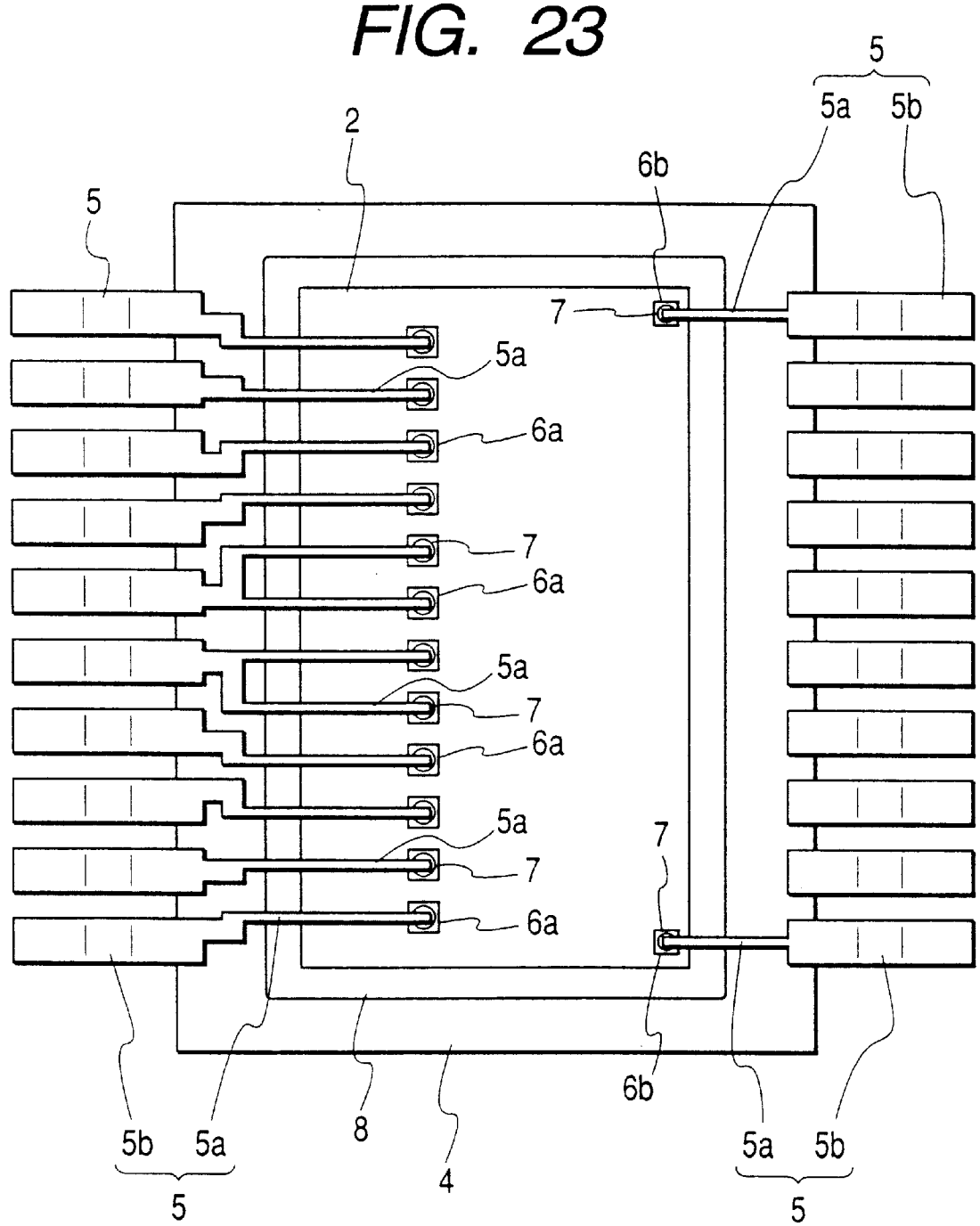
FIG. 23 is a plan view of the semiconductor device of Embodiment 1 according to the present invention.
Figure 24:
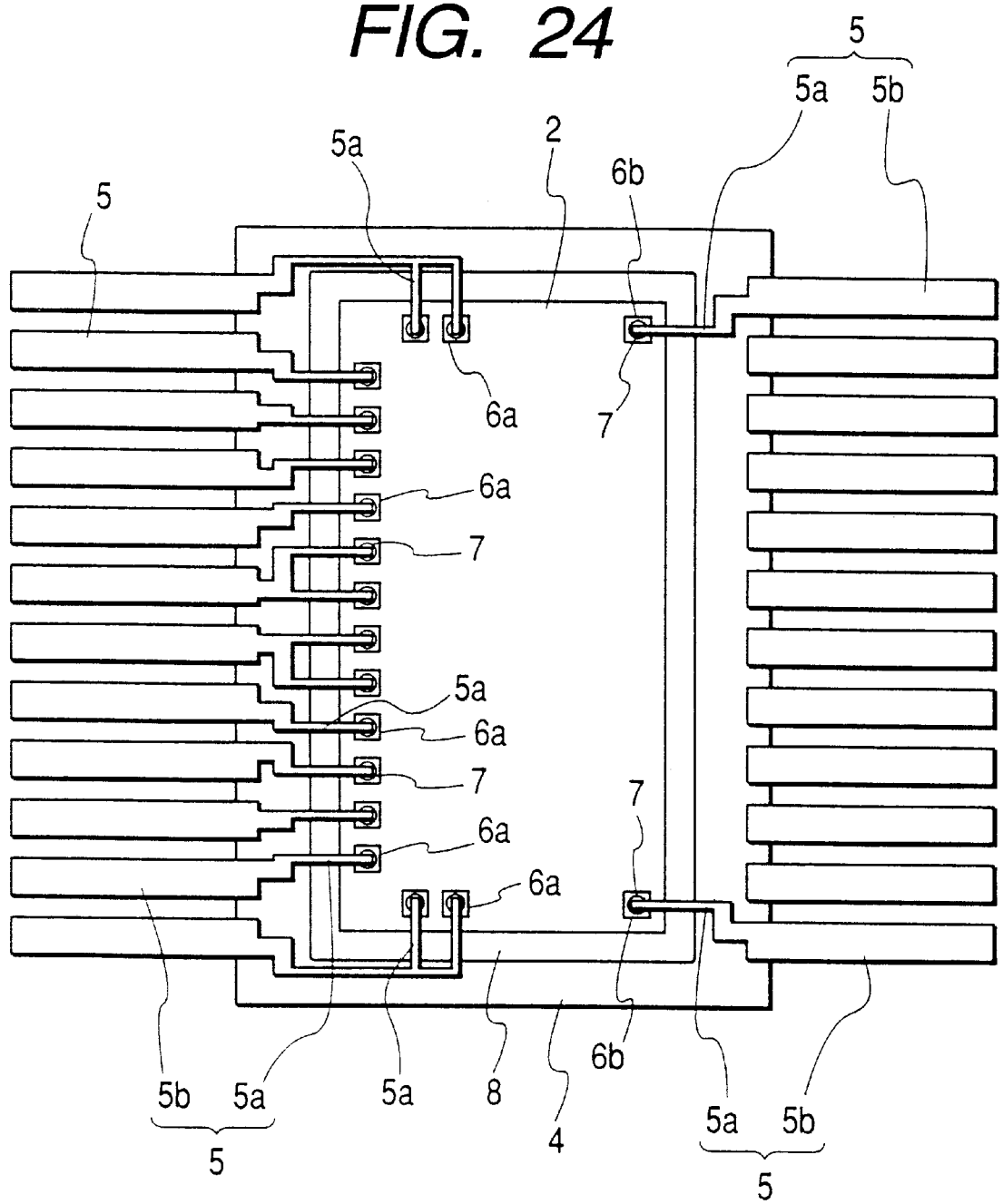
FIG. 24 is a plan view of the semiconductor device of Embodiment 1 according to the present invention.

Further, the TCP 1A of this embodiment according to the present invention is also applicable to cases where as shown in FIG. 21, the bonding pads (effective pins) 6a are disposed in part of the area on one side of the semiconductor chip 2, where as shown in FIG. 22, the bonding pads (effective pins) 6a are disposed in a row along the centerline of the semiconductor chip 2, where as shown in FIG. 23, the bonding pads (effective pins) 6a are disposed in a row near the intermediate position between the periphery and centerline of the semiconductor chip 2 and where as shown in FIG. 24, some bonding pads (effective pins) 6a are also disposed on the short sides of the semiconductor chip 2, that is, the bonding pads (effective pins) 6a are disposed on the three sides of the semiconductor chip 2.

Figure 25:
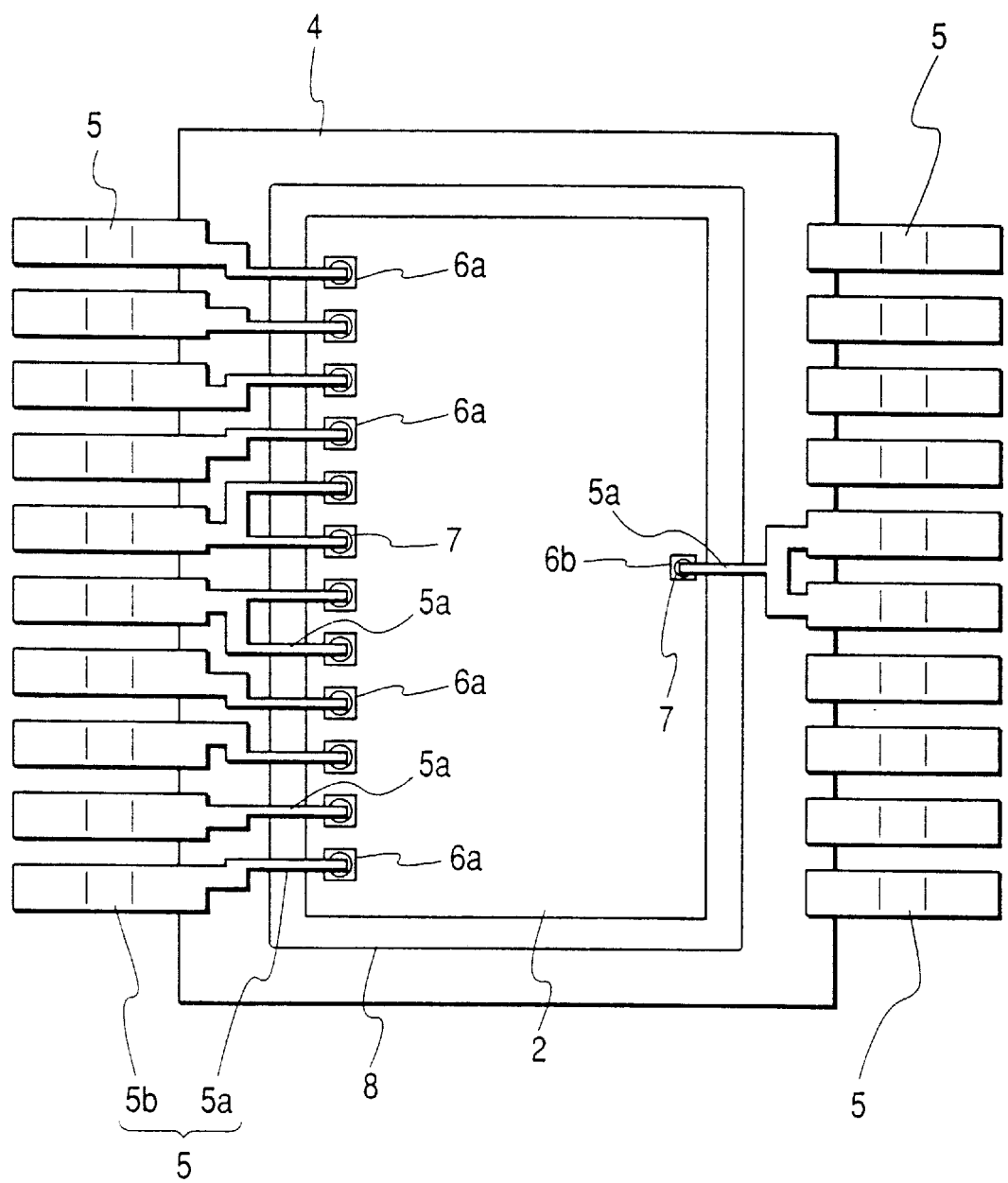
FIG. 25 is a plan view of the semiconductor device of Embodiment 1 according to the present invention.

Further, the number of dummy pads 6b to be formed on the semiconductor chip 2 is not limited to two and the positions where they are arranged are not also limited to the corner portions. As shown in FIG. 25, for example, only one dummy pad 6b may be formed near the intermediate position of the side opposite to the side on which the bonding pads (effective pins) 6a are disposed, or more than two dummy pads 6b may be disposed on condition that an area large enough for the dummy pads 6b to be disposed is available on the major surface of the semiconductor chip 2.

Embodiment 2

Figure 26:
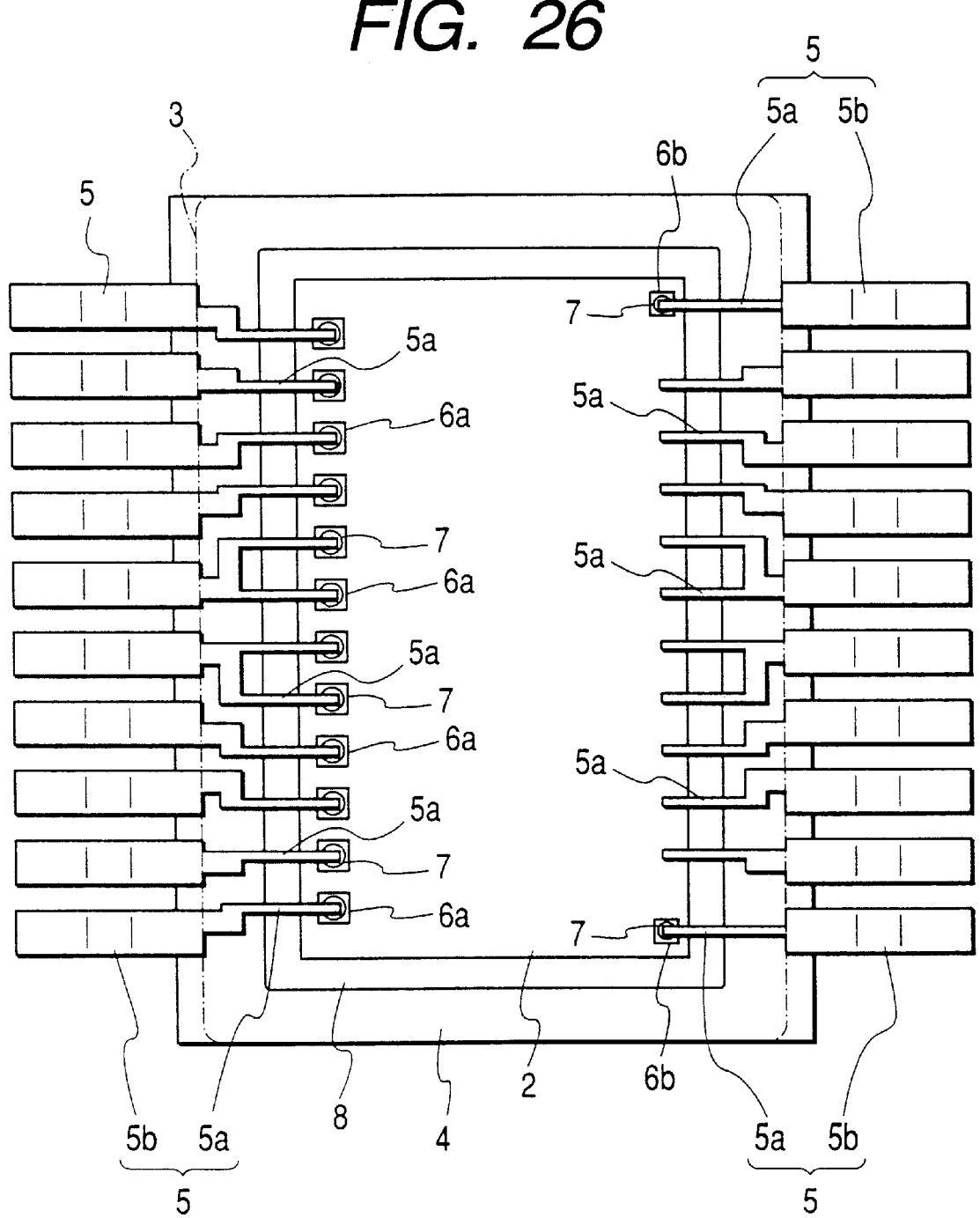
FIG. 26 is a plan view of a semiconductor device of Embodiment 2 according to the present invention.

FIG. 26 is a plan view of a TCP 1B of this embodiment according to the present invention. The feature of the TCP 1B is that all dummy leads which are formed along a side (a long side on the left-hand side of FIG. 26) on which bending pads (effective pins) 6a are disposed have inner lead portions 5a together with cuter lead portions 5b, respectively. Of these dummy leads 5, the leads 5 near the respective dummy pads 6b (two leads 5 positioned at the respective ends of dummy lead array) formed on the major surface of a semiconductor chip 2 are such that though their inner lead portions 5a are joined to respective dummy pads 6b and used to support the semiconductor chip 2, the inner lead portions 5a of the other leads 5 whose leading ends are extended over the semiconductor chip 2 are not used to support the semiconductor chip 2.

With the TCP 1B thus structured of this embodiment according to the present invention, as the inner lead portions 5a are disposed at predetermined intervals above the gaps between the semiconductor chip 2 and an insulating tape 4 in areas along the two opposed long sides of the semiconductor chip 2, a potting resin 3 is never allowed to penetrate through the gaps and excessively go around the side face of the semiconductor chip 2 even when the potting resin 3 is applied to the major surface of the semiconductor chip 2 at the step of resin-encapsulating the semiconductor chip 2 (see FIG. 9).

Figure 27:
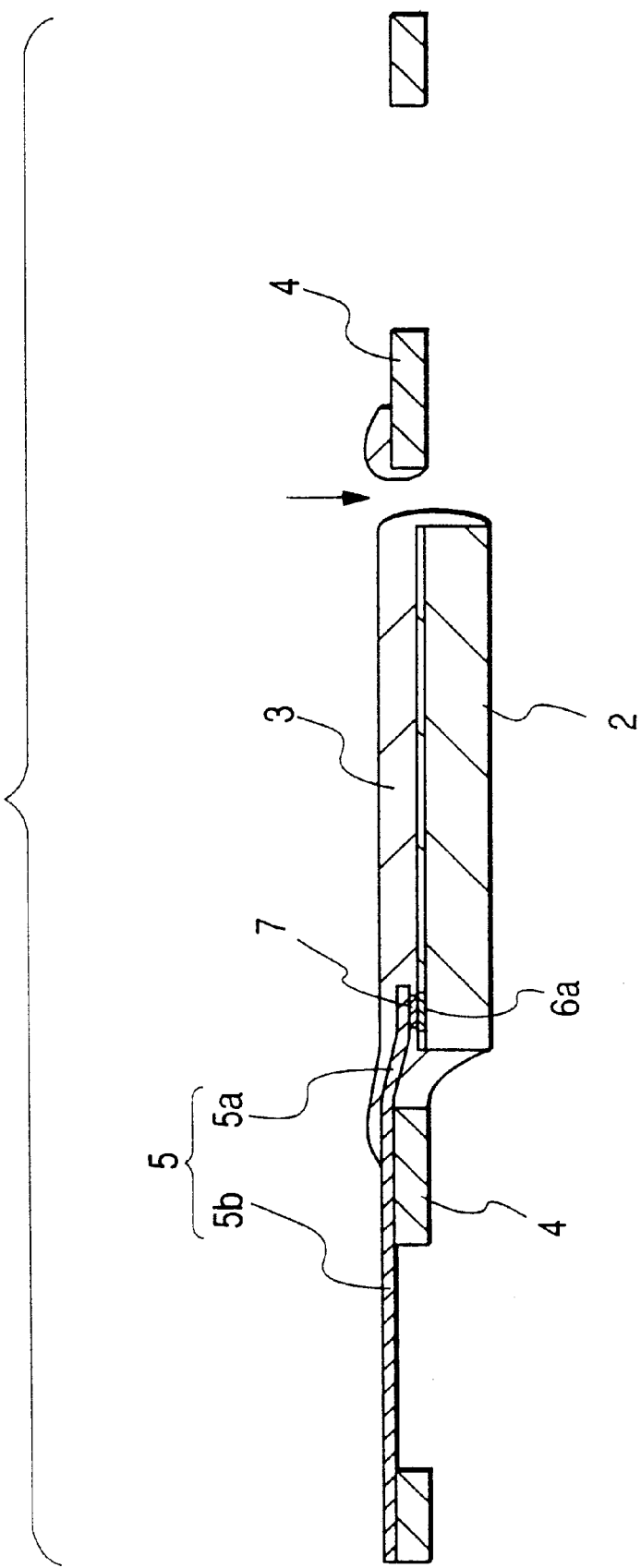
FIG. 27 is a sectional view showing a process for producing the semiconductor device of Embodiment 2 according to the present invention.

In the case where the inner lead portion 5a is provided at both ends of the dummy lead array as in the TCP 1A of the preceding embodiment according to the present invention (see FIG. 4), the potting resin 3 is allowed to penetrate through the gap in the area along one of the long sides (long right-hand side of FIG. 9) of the semiconductor chip 2 and excessively go around the side face thereof. Consequently, part of the gap in that area does not become filled with the resin as shown in FIG. 27.

Since the aforementioned drawback is made avoidable and the workability at the resin-encapsulating step is made also improvable by the TCP 1B of this embodiment according to the present invention, it is possible to improve the throughput and yield of the TCP 1B. The pitch of the above-described inner lead portions 5a is preferably set not greater than half the inner diameter of the nozzle of a dispenser 13 to be used when the potting resin 3 is applied.

Figure 28:
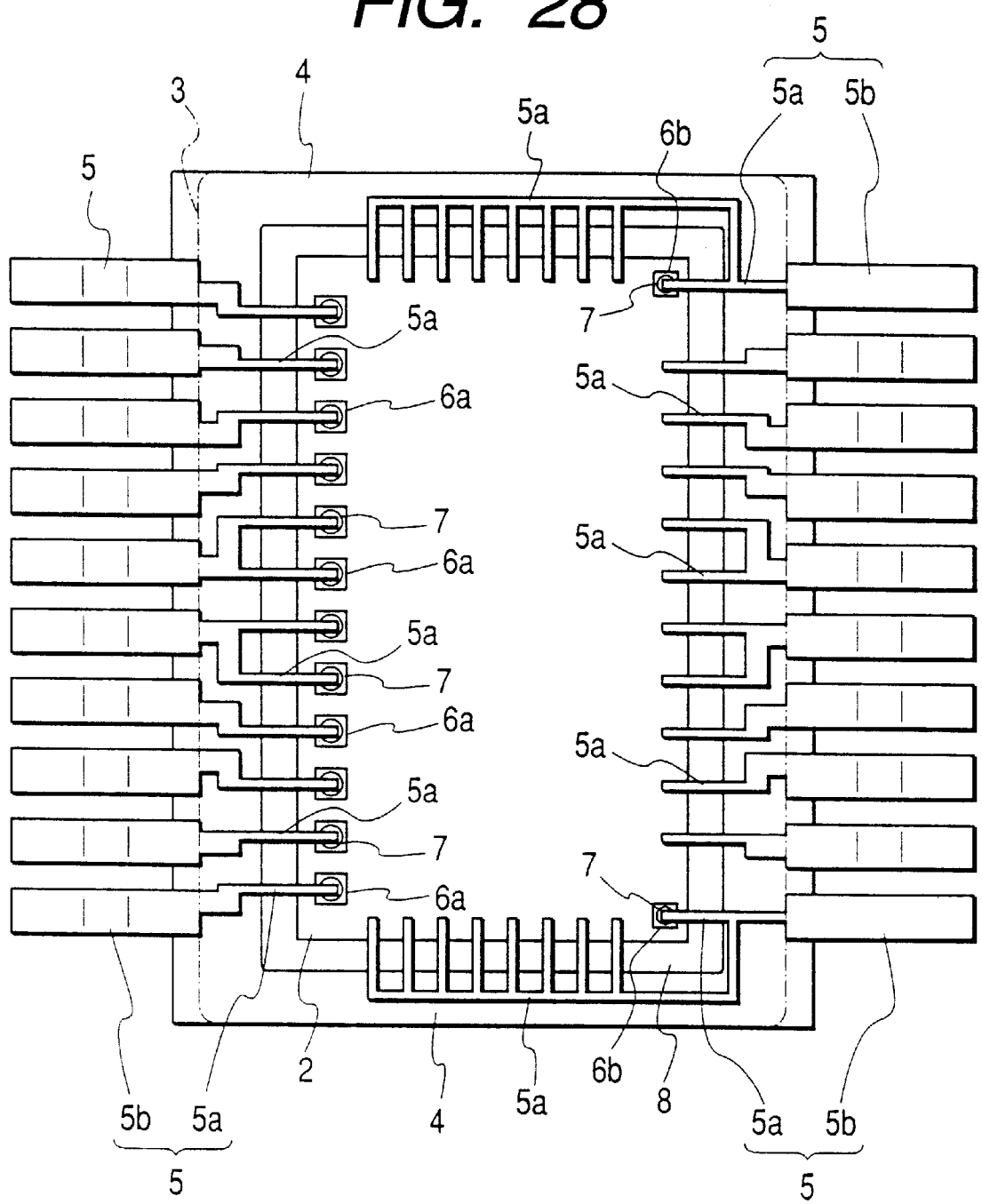
FIG. 28 is a plan view of the semiconductor device of Embodiment 2 according to the present invention.

In the TCP 1B shown in FIG. 28 of this embodiment according to the present invention, dummy inner lead portions 5a are disposed even in areas along the other two sides (upper and lower sides) of the semiconductor chip 2. The inner lead portion 5a provided in this area is formed by branching part of the inner lead portion 5a connected to, for example, the dummy pad 6b. In this case, the inner lead portions 5a are disposed in the areas along all sides of the semiconductor chip 2 in the TCP 1B to ensure that the drawback that the gaps between the insulating tape 4 and the semiconductor chip 2 cannot be filled with the resin becomes preventable.

Embodiment 3

Figure 29A:
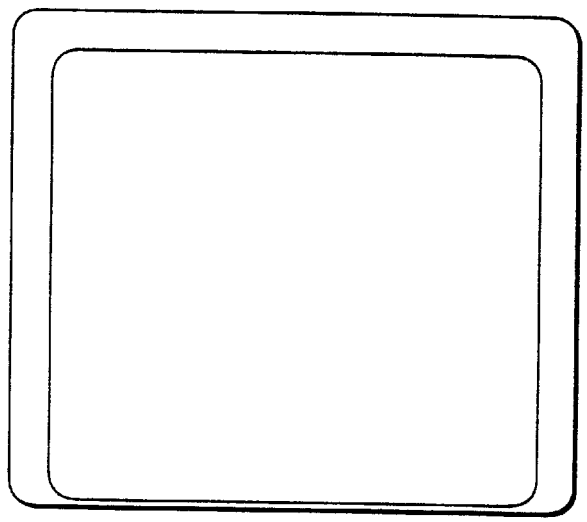
FIGS. 29(*a*) and 29(*b*) are a plan view of an IC card in which the semiconductor device is loaded according to the present invention.
Figure 29B:
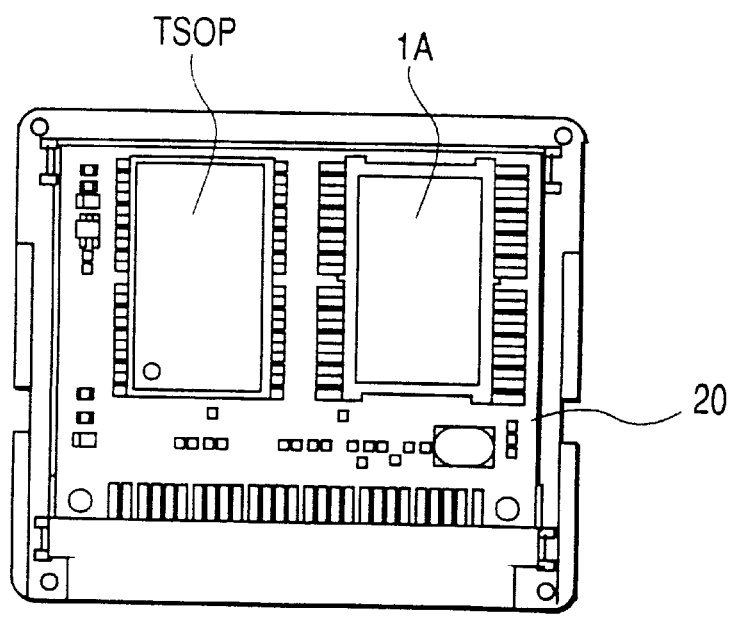
Figure 30A:
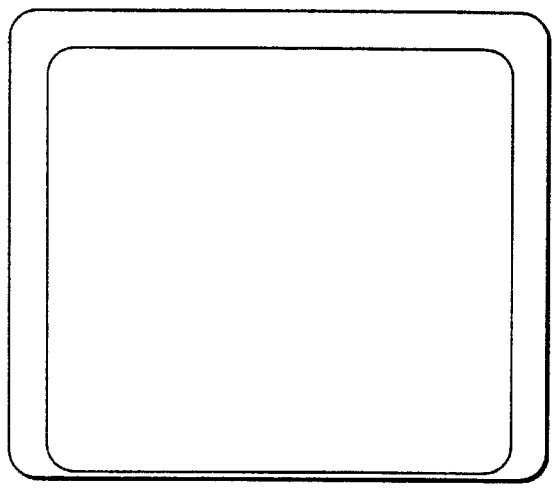
FIGS. 30(*a*) and 30(*b*) are a plan view of the IC card in which the semiconductor device is loaded according to the present invention.
Figure 30B:
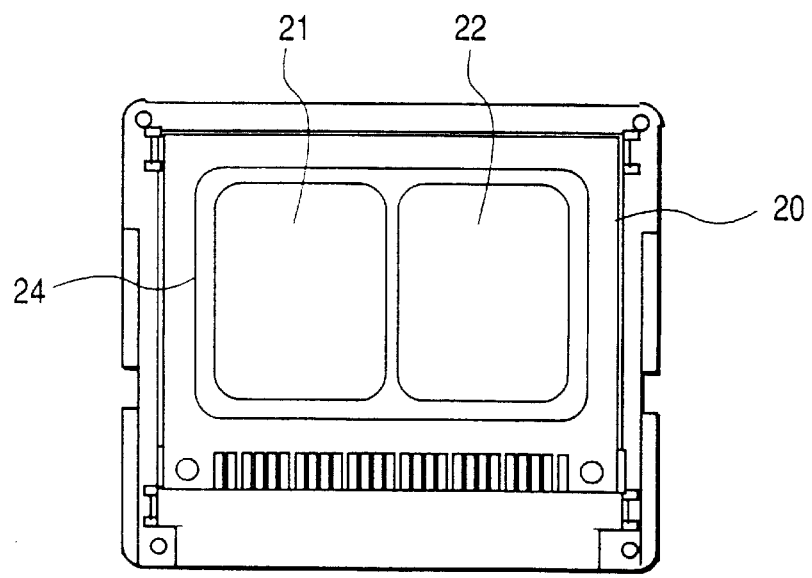

FIG. 29 and 30 are plan views of an IC card mounted with a TCP 1A of the embodiment 1 of the present invention (or a TCP 1B of the embodiment 1 of the present invention); and FIG. 30 a sectional view of the IC card. FIG. 25 (a) is an external view of the front side of the IC card, and FIG. 29 (b) shows a mounting portion on the front side thereof. FIG. 30 (a) is an external view of the back side of the IC card, and FIG. 30 (b) shows a mounting portion on the back side thereof.

The external dimensions of the IC card are, for example, length×width×thickness=36.4 mm×42.8 mm×3.3 mm and has a built-in printed wiring board 20 on which a TCP is mounted. As shown in FIGS. 29 (b) and 31, the TCP 1A of Embodiment 1 according to the present invention and a TSOP (Thin Small Outline Package) are mounted on the front side of the printed wiring board 20. The TCP 1A has a two-stage stacked structure as shown in FIG. 17, for example. Moreover, a semiconductor chip forming a DRAM (Dynamic Random Access Memory), for example, is sealed in the TSOP.

Figure 31:
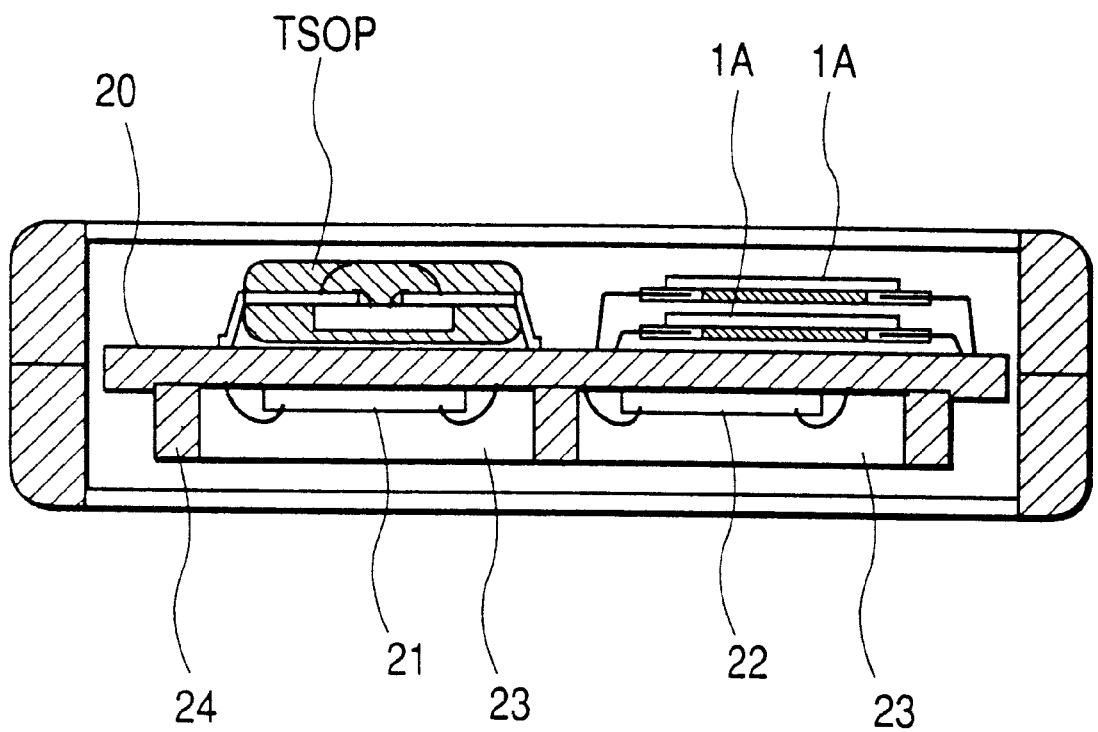
FIG. 31 is a sectional view of the IC card in which the semiconductor device is loaded according to the present invention.

As shown in FIGS. 30 (b) and FIG. 31, further, two semiconductor chips 21, 22 of a COB (Chip on Board) system are mounted on the back side of the printed wiring board 20. A microcomputer, for example is formed in one semiconductor chip 21, whereas an ASIC (Application Specific Integrated Circuit), for example, a gate array is formed in the other semiconductor chip 22. The semiconductor chips 21, 22 are separated from each ether by a dam frame 24 which is filled with silicons resin 23.

The TCP 1A and the TSOP are both simultaneously mounted on the surface of the printed wiring board 20 by a solder reflow method. Further, the semiconductor chips 21, 22 are joined with an adhesive to the back side of the printed wiring board 20 fitted with the dam frame 24, electrically connected to the printed wiring board 20 by the wire bending method and then encapsulated with silicons resin 23.

Since the TCP 1A which is thinner than any other LSI package is mounted on the semiconductor chip used to form a flash memory of this embodiment according to the present invention, the memory capacity of the IC card can be increased.

Although a description has been given of the invention made by the present inventors on the basis of the above-described embodiments thereof, the present invention is not limited to the above-described embodiments thereof but may needless to say be modified in various manners without departing from the gist of the invention.

In the TCP according to the present invention, part of the bonding pads (effective pins) formed on the semiconductor chip, for example, GND pads (GND pin) and the like may simultaneously be used as dummy pads.

The present invention is applicable to not only a TCP in which a semiconductor chip is encapsulated with bonding resin but also a TCP such that a semiconductor chip is encapsulated with molding resin. In other words, according to the present invention, the displacement of a semiconductor chip due to the flow of the molten resin injected into a molding die is preventable.

The present invention is also applicable to a TCP fabricated by such a method for forming bump electrodes on inner lead portions using a transfer method.

The present invention is further applicable to not only a flash memory but also a TCP where a semiconductor chip forming a memory LSI, a microcomputer, a logic LSI or the like is mounted. The present invention is applicable to a TCP where a semiconductor chip in which at least bonding pads are disposed so that they are unevenly arranged in a specific area en the major surface of the semiconductor chip is mounted.

A brief description will be subsequently given of the effect achievable by exemplary TCPs as disclosed in the present application.

The thickness of the TCP for the semiconductor chip of the one-side pad arranging system is made uniform, improving the yield of the TCP according to the present invention.

The workability of assembling the TCP for the semiconductor chip of the one-side pad arranging system is improvable according to the present invention.

Since the semiconductor chip of the one-side pad arranging system that has been difficult to mount in the TCP is readily mounted therein, a range of semiconductor products employing the TCP can be widened according to the present invention.

The drawback that the gap between the insulating tape and the semiconductor chip is left unfilled is reliably prevented, improving the reliability and yield of the TCP according to the present invention.

The memory capacity of the thin semiconductor device such an IC card can be increased according to the present invention.

What is claimed is:

1. A semiconductor device comprising:
(a) an insulating tape having a hole of rectangular shape, said hole being defined by a pair of opposed longer side ends extending in a first direction and a pair of opposed shorter side ends extending in a second direction substantially perpendicular to said first direction;
(b) a semiconductor chip having a main surface of a rectangular shape, said main surface having a pair of opposed longer edges extending in said first direction and a pair of opposed shorter edges extending in said second direction, said semiconductor chip being disposed in said hole of said insulating tape;

said semiconductor chip having:

an integrated circuit having a plurality of semiconductor elements, being formed on said main surface;

first bonding pads being formed on said main surface and being arranged along one of said pair of opposed longer edge of said main surface of said semiconductor chip and being electrically connected with said integrated circuit, said first bonding pads being arranged at a first interval in said first direction; and second bonding pads being formed on said main surface and being arranged along the other of said pair of opposed longer edge of said main surface of said semiconductor chip and being not electrically connected with said integrated circuit, said second bonding pads being arranged at a second interval in said first direction, said second interval being wider than said first interval;

(c) first leads disposed on said insulating tape and extending in said second direction, said first leads crossing one of said pair of opposed longer side ends of said insulating tape and said one of said pair of opposed longer edge of said main surface of said semiconductor chip, and having one end disposed on said main surface of said semiconductor chip;

(d) second leads disposed on said insulating tape and extending in said second direction, said second leads crossing the other of said pair of opposed longer side ends and the other of said pair of opposed longer edges of said main surface of said semiconductor chip, and having one end disposed on said main surface of said semiconductor chip;

(e) third leads disposed on said insulating tape and extending in said second direction, said third leads crossing the other of said pair of opposed longer side ends and the other of said pair of longer sides of said main surface of said semiconductor chip, and having one end disposed on said main surface of said semiconductor chip; and (f) a resin member sealing said main surface of said semiconductor chip, said one end of said first to third leads and a space defined by said semiconductor chip and said insulating tape in a plane view, wherein said one ends of said first leads are connected to said first bonding pads via first bump electrodes, wherein said one ends of said second leads are connected to said second bonding pads via second bump electrodes, wherein said one ends of said third leads are spaced from said main surface of said semiconductor chip, wherein a portion of said resin member extends onto said third leads at said space defined by said semiconductor chip and said insulating tape, and wherein said third leads are disposed between said second leads in said first direction.

2. A semiconductor device according to claim 1, wherein said resin member includes a potting resin applied by a dispenser.

3. A semiconductor device according to claim 1, wherein each of said first leads includes an outer lead portion protruding outwardly from said resin member, and wherein said first leads includes signal leads and power supply leads.

4. A semiconductor device according to claim 3, wherein each of said second and third leads includes an outer lead portion protruding outwardly from said resin member, and wherein each of said second and third leads is a lead which is not electrically connected to said semiconductor chip.

5. A semiconductor device according to claim 1, further comprising fourth leads disposed on said insulating tape,
wherein said fourth leads cross said pair of opposed shorter side ends of said main surface of said semiconductor chip, and have one ends disposed on said main surface of said semiconductor chip, and wherein a portion of said resin member extends on said fourth leads at said space defined by said semiconductor chip and said insulating tape.

6. A semiconductor device according to claim 5, wherein said fourth leads are continuously formed with said second leads on said insulating tape.

7. A semiconductor device comprising:

(a) an insulating tape having a hole of rectangular shape, said hole being defined by a pair of opposed longer side ends extending in a first direction and a pair of opposed shorter side ends extending in a second direction substantially perpendicular to said first direction;

(b) a semiconductor chip having a main surface of a rectangular shape, said main surface having a pair of opposed longer edges extending in said first direction and a pair of opposed shorter edges extending in said second direction, said semiconductor chip being disposed in said hole of said insulating tape;

said semiconductor chip having:

an integrated circuit having a plurality of semiconductor elements, being formed on said main surface;

first bonding pads being formed on said main surface and being arranged along one of said pair of opposed longer edge of said main surface of said semiconductor chip and being electrically connected with said integrated circuit, said first bonding pads being arranged at a first interval in said first direction; and second bonding pads being formed on said main surface and being arranged along the other of said pair of opposed longer edge of said main surface of said semiconductor chip and being not electrically connected with said integrated circuit, said second bonding pads being arranged at a second interval in said first direction, said second interval being wider than said first interval;

(c) first leads disposed on said insulating tape and extending in said second direction, said first leads crossing one of said pair of opposed longer side ends of said insulating tape and said one of said pair of opposed longer edge of said main surface of said semiconductor chip, and having one end disposed on said main surface of said semiconductor chip;

(d) second leads disposed on said insulating tape and having one end disposed on said main surface of said semiconductor chip;

(e) third leads disposed on said insulating tape and having one end disposed on said main surface of said semiconductor chip; and (f) a resin member sealing said main surface of said semiconductor chip, said one end of said first to third leads and a space defined by said semiconductor chip and said insulating tape in a plane view, wherein said one ends of said first leads are connected to said first bonding pads via first bump electrodes, wherein said one ends of said second leads are connected to said second bonding pads via second bump electrodes, wherein said one ends of said third leads are spaced from said main surface of said semiconductor chip, wherein a portion of said resin member extends onto said third leads at said space defined by said semiconductor chip and said insulating tape, and wherein said third leads are disposed between said second leads in said first direction.

8. A semiconductor device according to claim 7, wherein said resin member includes a potting resin applied by a dispenser.

9. A semiconductor device according to claim 7, wherein each of said first leads includes an outer lead portion protruding outwardly from said resin member, and wherein said first leads includes signal leads and power supply leads.

10. A semiconductor device according to claim 9, wherein each of said second and third leads includes an outer lead portion protruding outwardly from said resin member, and wherein each of said second and third leads is a lead which is not electrically connected to said semiconductor chip.

11. A semiconductor device comprising:

(a) an insulating tape having a hole of rectangular shape, said hole being defined by a pair of opposed longer side ends extending in a first direction and a pair of opposed shorter side ends extending in a second direction substantially perpendicular to said first direction;

(b) a semiconductor chip having a main surface of a rectangular shape, said main surface having a pair of opposed longer edges extending in said first direction and a pair of opposed shorter edges extending in said second direction, said semiconductor chip being disposed in said hole of said insulating tape;

said semiconductor chip having:

an integrated circuit having a plurality of semiconductor elements, being formed on said main surface;

first bonding pads being formed on said main surface and being arranged along one of said pair of opposed longer edge of said main surface of said semiconductor chip and being electrically connected with said integrated circuit; and a second bonding pad being formed on said main surface and being arranged at the other of said pair of opposed longer edges of said main surface of said semiconductor chip and being not electrically connected with said integrated circuit;

(c) first leads disposed on said insulating tape and extending in said second direction, said first leads crossing one of said pair of opposed longer side ends of said insulating tape and said one of said pair of opposed longer edge of said main surface of said semiconductor chip, and having one end disposed on said main surface of said semiconductor chip;

(d) a second lead disposed on said insulating tape and extending in said second direction, said second lead crossing the other of said pair of opposed longer side ends and the other of said pair of opposed longer edges of said main surface of said semiconductor chip, and having one end disposed on said main surface of said semiconductor chip;

(e) third leads disposed on said insulating tape and extending in said second direction, said third leads crossing the other of said pair of opposed longer side ends and the other of said pair of longer sides of said main surface of said semiconductor chip, and having one end disposed on said main surface of said semiconductor chip; and (f) a resin member sealing said main surface of said semiconductor chip, said one end of said first to third leads and a space defined by said semiconductor chip and said insulating tape in a plane view, wherein said one ends of said first leads are connected to said first bonding pads via first bump electrodes, wherein said one ends of said second lead is connected to said second bonding pad via a second bump electrode, wherein said one ends of said third leads are spaced from said main surface of said semiconductor chip, wherein a portion of said resin member extends onto said third leads at said space defined by said semiconductor chip and said insulating tape, and wherein said third leads are disposed at both sides of said second lead in said first direction.

* * * * *